(12) United States Patent
Yamano

(10) Patent No.: US 9,341,841 B2
(45) Date of Patent: May 17, 2016

(54) OPTICAL SCANNER, IMAGE DISPLAY APPARATUS, AND HEAD-MOUNT DISPLAY

(71) Applicant: Seiko Epson Corporation, Tokyo (JP)

(72) Inventor: Yukihide Yamano, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/582,407

(22) Filed: Dec. 24, 2014

(65) Prior Publication Data

US 2015/0185471 A1 Jul. 2, 2015

(30) Foreign Application Priority Data

Dec. 26, 2013 (JP) ................................ 2013-268715

(51) Int. Cl.
| G02B 26/08 | (2006.01) |
| G02B 26/10 | (2006.01) |
| B81B 3/00 | (2006.01) |
| G02B 27/01 | (2006.01) |

(52) U.S. Cl.
CPC ............ *G02B 26/101* (2013.01); *B81B 3/0045* (2013.01); *G02B 26/085* (2013.01); *B81B 2201/042* (2013.01); *B81B 2203/0154* (2013.01); *G02B 27/0101* (2013.01); *G02B 27/0172* (2013.01)

(58) Field of Classification Search
CPC ............... G02B 26/101; G02B 26/105; G02B 26/0833; G02B 26/0841; G02B 26/085; G02B 26/0858; G02B 26/0866; G02B 27/0176
USPC ...................... 359/196.1–215.1, 220.1–226.2
See application file for complete search history.

(56) References Cited

U.S. PATENT DOCUMENTS

| 7,190,502 B2 | 3/2007 | Filhol |
| 7,724,411 B2 | 5/2010 | Ko et al. |
| 2012/0086996 A1 | 4/2012 | Mizoguchi et al. |
| 2013/0301099 A1 | 11/2013 | Mizoguchi et al. |
| 2014/0368892 A1* | 12/2014 | Mizoguchi ............ H04N 1/036 358/484 |
| 2015/0185470 A1 | 7/2015 | Yamano |
| 2015/0185471 A1 | 7/2015 | Yamano |

FOREIGN PATENT DOCUMENTS

| JP | 07-181414 | 7/1995 |
| JP | 10-197819 | 7/1998 |
| JP | 2005-122131 | 5/2005 |
| JP | 2009-075587 A | 4/2009 |
| JP | 2012-078738 A | 4/2012 |
| JP | 2013-235200 A | 11/2013 |
| JP | 2015-125219 A | 7/2015 |
| JP | 2015-125220 A | 7/2015 |

* cited by examiner

*Primary Examiner* — James Phan
(74) *Attorney, Agent, or Firm* — Harness, Dickey & Pierce, P.L.C.

(57) ABSTRACT

An optical scanner includes: a base portion; a light reflecting portion that reflects light; a connection portion that connects the base portion and the light reflecting portion; and a shaft portion that supports the base portion in a swingable manner about a swing axis, wherein the light reflecting portion is disposed so that a geometrical center of the light reflecting portion is separated from the swing axis in a plan view seen in a direction in which the light reflecting portion and the base portion are lined up, and wherein a geometrical center of at least one of the base portion and the connection portion is positioned on an opposite side of the geometrical center of the light reflecting portion with respect to the swing axis in the plan view.

20 Claims, 14 Drawing Sheets

OPTICAL SCANNER, IMAGE DISPLAY APPARATUS, AND HEAD-MOUNT DISPLAY

BACKGROUND

1. Technical Field

The present invention relates to an optical scanner, an image display apparatus, and a head-mount display.

2. Related Art

For example, as an image display apparatus such as a head-mount display, a projector, or the like, an optical scanner that performs 2-dimensional scanning with light may be included.

An optical scanner according to JP-A-2009-75587 includes a frame, an outer driving portion that is suspended to the frame through a first torsion spring and that can rotate about a first axis, an inner driving portion that is suspended to the outer driving portion through a second torsion spring, and that can rotate about a second axis orthogonal to the first axis, and a stage that is arranged on the upper portion of the inner driving portion, and rotates together with the inner driving portion.

In the optical scanner according to JP-A-2009-75587, the outer driving portion is rotated about the first axis, and also the inner driving portion is rotated about the second axis by Lorentz force generated by electric currents that flow through coils provided respectively in the inner driving portion and the outer driving portion and a magnetic field between a pair of magnets arranged on both sides of the frame. Accordingly, scanning is performed by reflecting light on a mirror surface formed on the stage.

Here, the stage is formed in a disk shape, is linked to the inner driving portion through a linking portion protruding so that the center of the stage and the central axis are identical to each other, and is arranged so as to be symmetrical with respect to the first axis and the second axis, respectively, in the plan view.

However, in this optical scanner, light is generally incident in a direction inclined to the mirror surface, and the spot shape of the light in the mirror surface forms an elliptical (oval) shape.

Accordingly, in an optical scanner disclosed in JP-A-2009-75587, there is a problem in that the mirror surface has an unnecessary region that is not used in the light reflection, or a portion of light is not incident on the mirror surface and is wasted.

SUMMARY

An advantage of some aspects of the invention is to provide an optical scanner, an image display apparatus, and a head-mount display that can realize the stable swing of the light reflecting portion, and that can form the light reflecting portion to have a plan view shape in which the utilization efficiency of the light reflection is high.

An aspect of the invention is directed to an optical scanner including a base portion; a light reflecting portion that reflects light; a connection portion that connects the base portion and the light reflecting portion; and a shaft portion that supports the base portion in a swingable manner about a swing axis. The light reflecting portion is disposed so that a geometrical center of the light reflecting portion is separated from the swing axis in a plan view seen in a direction in which the light reflecting portion and the base portion are lined up. A geometrical center of at least one of the base portion and the connection portion is positioned on an opposite side of the geometrical center of the light reflecting portion with respect to the swing axis in the plan view.

According to the optical scanner described above, the optical scanner can improve the balance of the moment of inertia of the mass formed with the base portion, the light reflecting portion, and the connection portion about the swing axis, so that the stable swing of the light reflecting portion is realized, and the light reflecting portion can be formed to have a plan view shape (the plan view shape in which the utilization efficiency of the light reflection is high) in which an unnecessary region which is not used in the light reflection is small.

Another aspect of the invention is directed to an optical scanner including a base portion; a light reflecting portion that reflects light; a connection portion that connects the base portion and the light reflecting portion; a frame body portion that is disposed to surround the base portion; a first shaft portion that connects the base portion and the frame body portion, and supports the base portion in a swingable manner about a first axis; and a second shaft portion that supports the frame body portion in a swingable manner about a second axis intersecting the first axis. The light reflecting portion is disposed so that a geometrical center of the light reflecting portion is positioned to be separated from the first axis or the second axis in a direction in which the light reflecting portion and the base portion are lined up. A geometrical center of at least one of the base portion and the connection portion is positioned on the opposite side of the geometrical center of the light reflecting portion with respect to the first axis or the second axis in the plan view.

In the optical scanner described above, the balance of the moment of inertia of the mass formed with the base portion, the light reflecting portion, and the connection portion about the swing axis can be improved, so that the stable swing of the light reflecting portion is realized, and the light reflecting portion can be formed to have a plan view shape (the plan view shape in which the utilization efficiency of the light reflection is high) in which an unnecessary region which is not used in the light reflection is small.

Light is generally incident in a direction inclined to a reflecting surface of the light reflecting portion. However, in a biaxial-type optical scanner in which the light reflecting portion swings about two axes, the light has to be incident to the light reflecting portion so that highly precise light scanning is performed and an axis of the light is identical to the intersecting point at which the first axis and the second axis intersect in the plan view. Therefore, if the light reflecting portion is formed to have the plan view shape in which an unnecessary region which is not used in the light reflection is small, a geometrical center of the light reflecting portion is separated from a geometrical center of the base portion in the plan view. Further, in the biaxial-type optical scanner, if the balance of the moment of inertia of the light reflecting portion about the swing axis (first axis or second axis) is poor, the balance of the swinging angle of the light reflecting portion becomes poor, and undesirably bent deformation of the first shaft portion or the second shaft portion occurs. Therefore, in the biaxial-type optical scanner, it is especially effective to adjust the center of gravity of the mass formed with the base portion, the light reflecting portion, and the connection portion (adjust the balance of the moment of inertia).

In the optical scanner according to the aspect of the invention, it is preferable that a geometrical center of the light reflecting portion is deviated from the first axis in the plan view.

In this case, if the center of gravity is not adjusted, problems occur in that the balance of the moment of inertia of the mass formed with the base portion, the light reflecting portion, and the connection portion about the first axis becomes poor, the balance of the swinging angle of the light reflecting portion about the first axis becomes poor, and undesirably bent deformation of the first shaft portion occurs according to the swing of the light reflecting portion about the second axis. Accordingly, the aspect of the invention can prevent or suppress the generation of the problem by adjusting the center of gravity.

In the optical scanner according to the aspect of the invention, it is preferable that a geometrical center of the light reflecting portion is deviated from the second axis in the plan view.

In this case, if the center of gravity is not adjusted, problems occur in that the balance of the moment of inertia of the mass formed with the base portion, the light reflecting portion, and the connection portion about the second axis becomes poor, the balance of the swinging angle of the light reflecting portion about the second axis becomes poor, and undesirably bent deformation of the second shaft portion occurs according to the swing of the light reflecting portion about the first axis. Accordingly, the aspect of the invention can prevent or suppress the generation of the problem by adjusting the center of gravity.

In the optical scanner according to the aspect of the invention, it is preferable that a geometrical center of the base portion is deviated from the first axis or the second axis in the plan view.

The base portion can be collectively formed together with the frame body portion, the first shaft portion, and the second shaft portion. Therefore, in this case, it is possible to reduce variations in the geometrical center of the base portion for each product.

In the optical scanner according to the aspect of the invention, it is preferable that a geometrical center of the connection portion is deviated from the first axis or the second axis in the plan view.

The connection portion can be collectively formed with the light reflecting portion. Therefore, in this case, it is possible to suppress the positional relationship between the geometrical center of the light reflecting portion and the geometrical center of the connection portion from varying for each product.

In the optical scanner according to the aspect of the invention, it is preferable that side surfaces of the connection portion have tapers inclined to a direction in which the light reflecting portion and the base portion are lined up.

With this configuration, it is possible to effectively adjust the balance of the moment of inertia of the mass formed with the base portion, the light reflecting portion, and the connection portion about the first axis or the second axis.

In the optical scanner according to the aspect of the invention, it is preferable that the tapers are disposed in a proximal portion and a distal portion with respect to the first axis or the second axis, and the proximal portion and the distal portion have different inclination angular degrees with respect to the direction in which the light reflecting portion and the base portion are lined up.

With this configuration, it is possible to effectively adjust the balance of the moment of inertia of the mass formed with the base portion, the light reflecting portion, and the connection portion about the first axis or the second axis.

In the optical scanner according to the aspect of the invention, it is preferable that both geometrical centers of the base portion and the connection portion are deviated from the first axis or the second axis in the plan view.

With this configuration, it is possible to effectively adjust the balance of the moment of inertia of the mass formed with the base portion, the light reflecting portion, and the connection portion about the first axis or the second axis.

In the optical scanner according to the aspect of the invention, it is preferable that a shape of the base portion is identical to a shape of the connection portion in the plan view.

With this configuration, when the base portion and the connection portion are connected, the positional determination becomes easy.

In the optical scanner according to the aspect of the invention, it is preferable that the light reflecting portion has an elliptical or oval shape along the first axis and the second axis in the plan view.

With this configuration, when the light is incident in the direction inclined to the reflecting surface of the light reflecting portion, it is possible to decrease the unnecessary region which is not used in the light reflection of the light reflecting portion.

Still another aspect of the invention is directed to an image display apparatus including the optical scanner according to the aspect of the invention.

With this configuration, the balance of the moment of inertia of the mass formed with the base portion, the light reflecting portion, and the connection portion about the swing axis can be improved, so that the stable swing of the light reflecting portion is realized, and the light reflecting portion can be formed to have a plan view shape in which an unnecessary region which is not used in the light reflection is small.

Yet another aspect of the invention is directed to a head-mount display including the optical scanner according to the aspect of the invention.

With this configuration, the balance of the moment of inertia of the mass formed with the base portion, the light reflecting portion, and the connection portion about the swing axis can be improved, so that the stable swing of the light reflecting portion is realized, and the light reflecting portion can be formed to have a plan view shape in which an unnecessary region which is not used in the light reflection is small.

BRIEF DESCRIPTION OF THE DRAWINGS

The invention will be described with reference to the accompanying drawings, wherein like numbers reference like elements.

FIGS. 6A and 6B are diagrams illustrating the light reflecting plate and the connection portion included in the optical scanner illustrated in FIG. 1, of which FIG. 6A is a cross-sectional view taken along the Y axis, and FIG. 6B is a rear view illustrating the light reflecting plate.

FIGS. 8A and 8B are diagrams illustrating a light reflecting plate and a connection portion included in an optical scanner according to a second embodiment of the invention, of which FIG. 8A is a cross-sectional view taken along the Y axis, and FIG. 8B is a rear view of the light reflecting plate.

DESCRIPTION OF EXEMPLARY EMBODIMENTS

Hereinafter, most preferred embodiments of an optical scanner, an image display apparatus, and a head-mount display according to the invention are described with reference to the accompanying drawings.

First Embodiment

Figure 1:
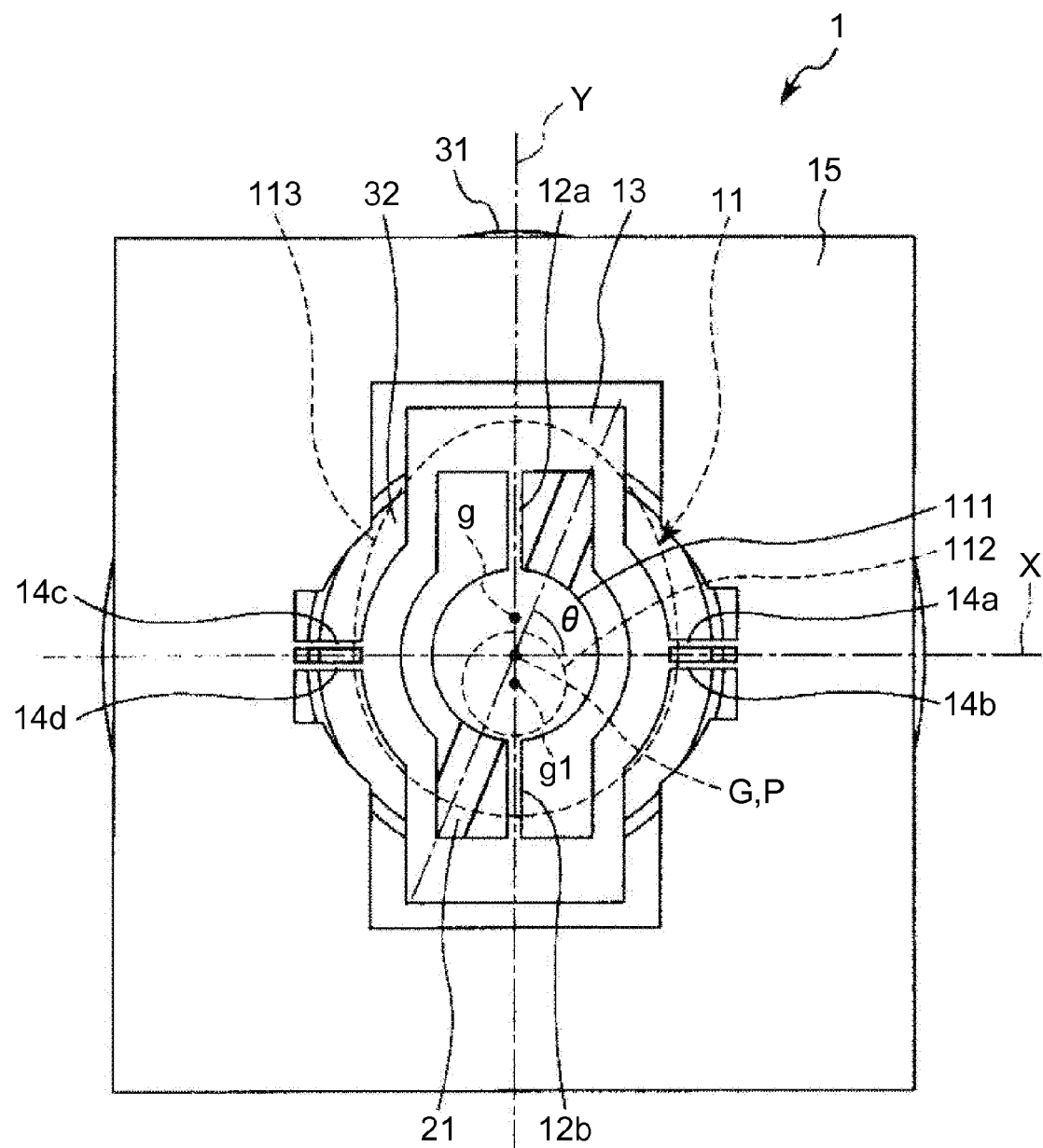
FIG. 1 is a plan view illustrating an optical scanner according to a first embodiment of the invention.
Figure 2:
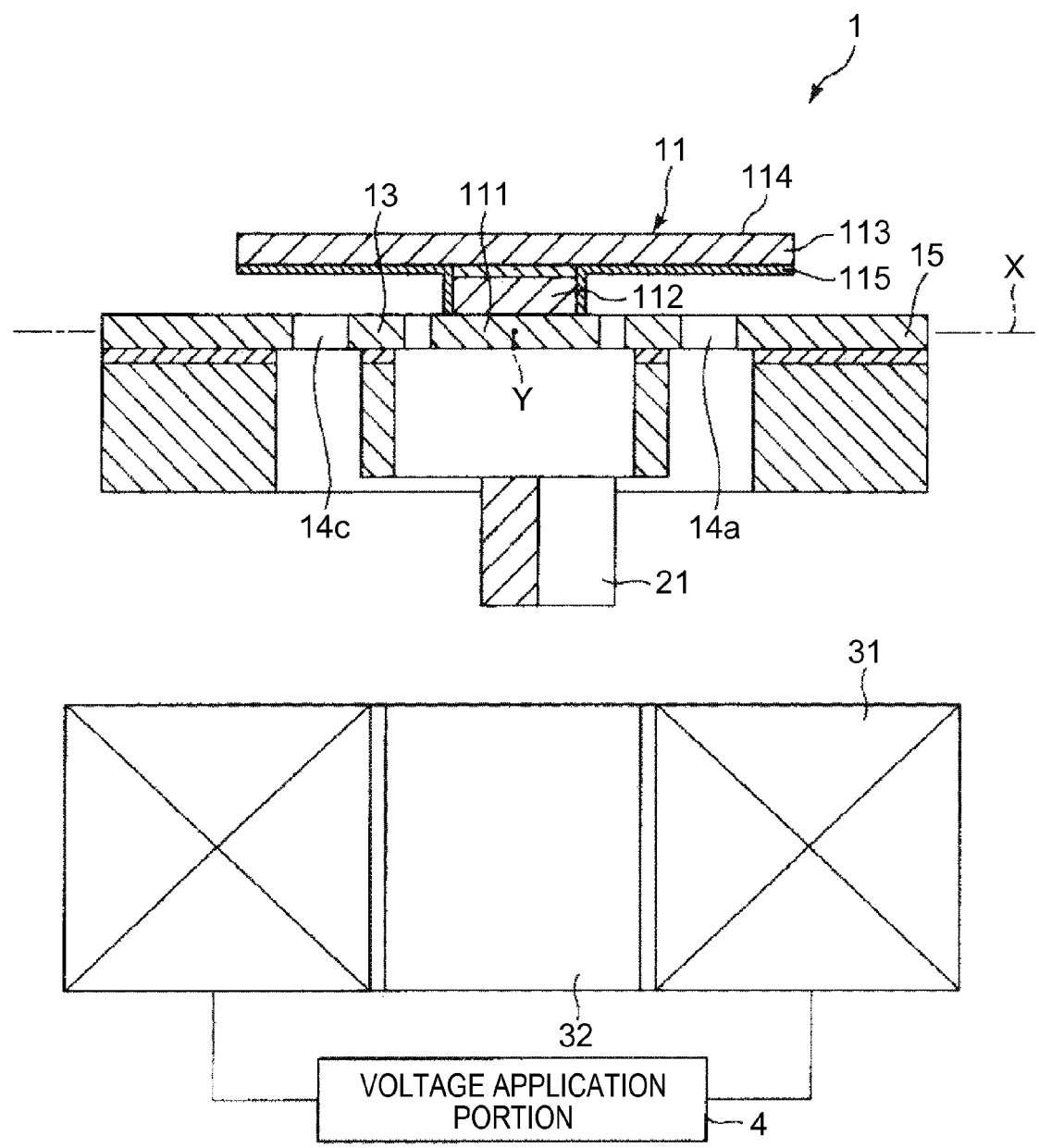
FIG. 2 is a cross-sectional view (cross-sectional view taken along X axis) illustrating the optical scanner illustrated in FIG. 1.
Figure 3:
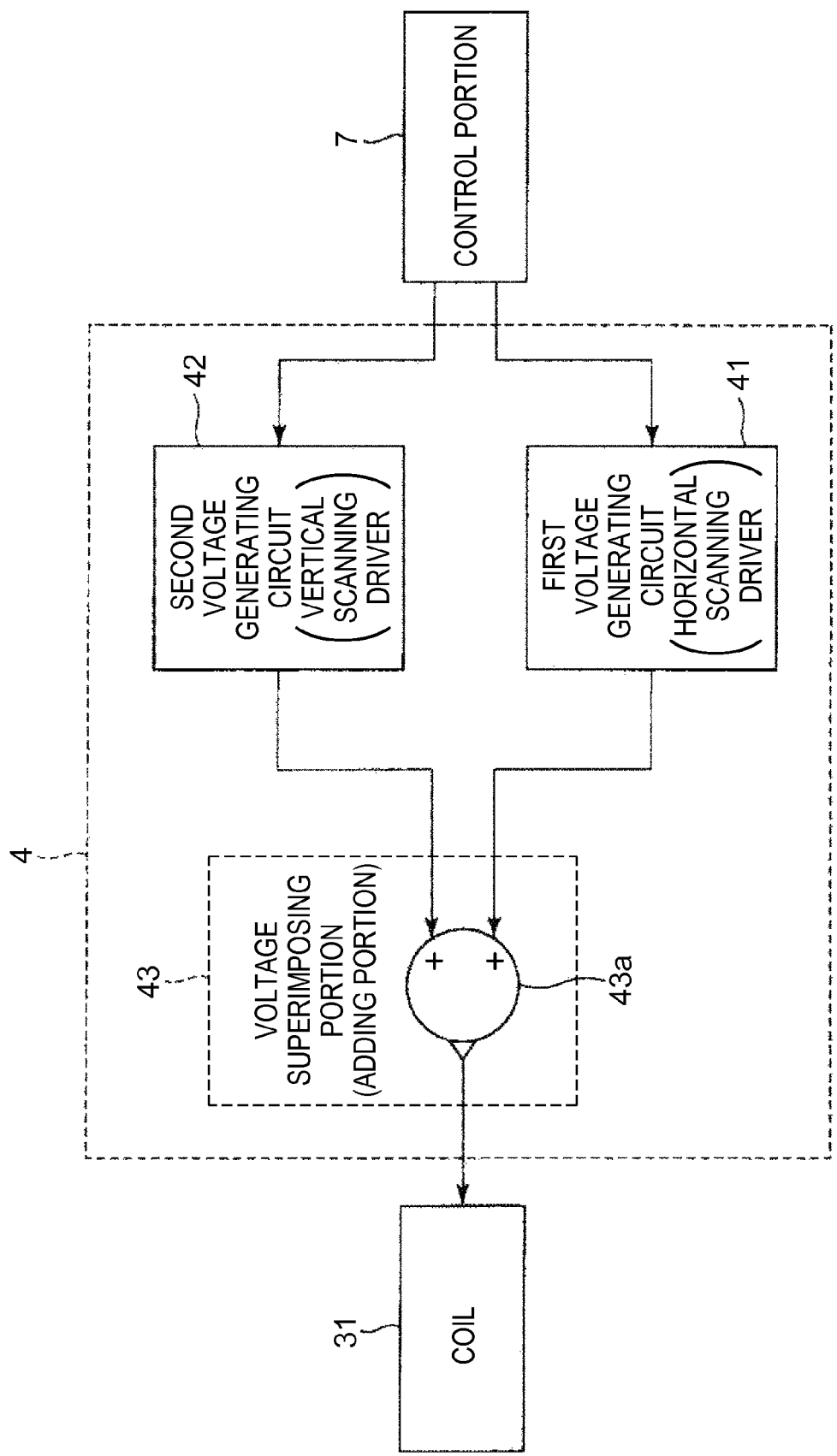
FIG. 3 is a block diagram illustrating a voltage application portion of a driving portion included in the optical scanner illustrated in FIG. 1.
Figure 4A:
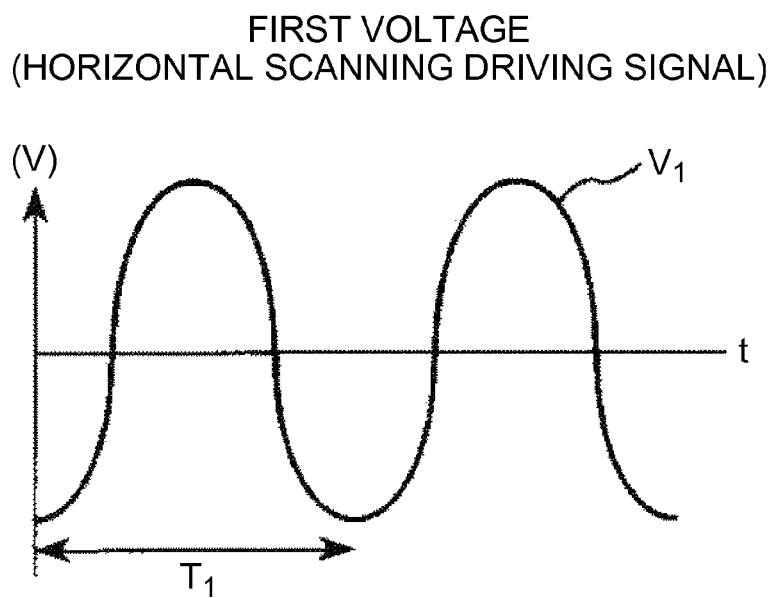
FIGS. 4A and 4B are diagrams illustrating an example of a generation voltage in a first voltage generating circuit and a second voltage generating circuit illustrated in FIG. 3.
Figure 4B:
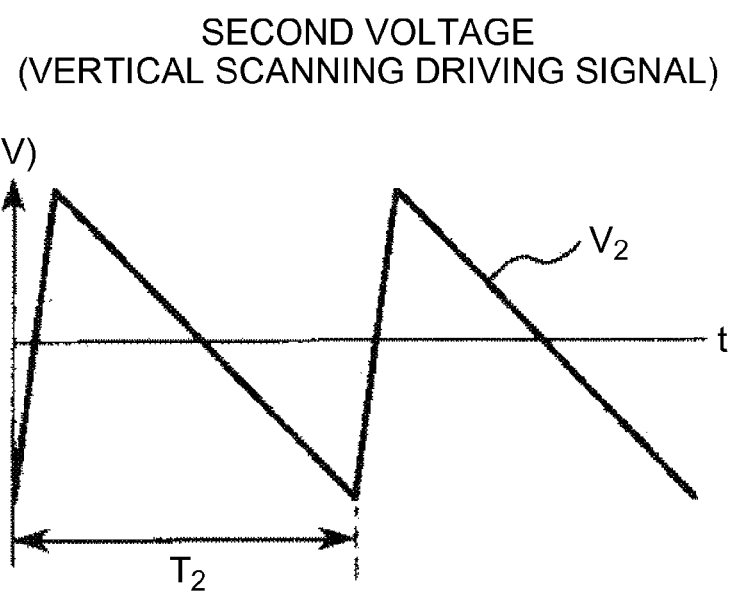

FIG. 1 is a plan view illustrating an optical scanner according to the first embodiment of the invention, and FIG. 2 is a cross-sectional view (cross-sectional view taken along X axis) illustrating the optical scanner illustrated in FIG. 1. FIG. 3 is a block diagram illustrating a voltage application portion of a driving portion included in the optical scanner illustrated in FIG. 1. FIGS. 4A and 4B are diagrams illustrating an example of a generation voltage in a first voltage generating circuit and a second voltage generating circuit illustrated in FIG. 3.

In addition, in the description below, for convenience of explanation, an upper side of FIG. 2 is referred to as "upper", and a lower side is referred to as "lower".

As illustrated in FIGS. 1 and 2, an optical scanner 1 is a biaxial-type optical scanner that swings a movable mirror portion 11 about two axes of an X axis and a Y axis. The optical scanner 1 includes the movable mirror portion 11, a pair of shaft portions 12a and 12b (first shaft portion), a frame body portion 13, two pairs of shaft portions 14a, 14b, 14c, and 14d (second shaft portion), a supporting portion 15, a permanent magnet 21, a coil 31, a magnetic core 32, and a voltage application portion 4. Also, through not illustrated in FIGS. 1 and 2, the optical scanner 1 includes a distortion detection element 51 (first distortion detection element) and a distortion detection element 52 (second distortion detection element) (see FIG. 5).

Here, the movable mirror portion 11 and the pair of shaft portions 12a and 12b configure a first vibration system that swings about the Y axis (first axis) (reciprocating movement). The movable mirror portion 11 and the pair of shaft portions 12a and 12b, the frame body portion 13, the two pairs of shaft portions 14a, 14b, 14c, and 14d, and the permanent magnet 21 configure a second vibration system that swings about the X axis (second axis) (reciprocating movement).

Also, the permanent magnet 21, the coil 31, and the voltage application portion 4 configure the driving portion that drives the first vibration system and the second vibration system (that is, swings the movable mirror portion 11 about the X axis and the Y axis).

Hereinafter, respective portions of the optical scanner 1 are sequentially and specifically described.

The movable mirror portion 11 includes a base portion (movable portion) 111, and a light reflecting plate 113 (light reflecting portion) fixed to the base portion 111 through a spacer 112 (connection portion).

A light reflecting surface 114 having light reflectivity is provided on the upper surface (one surface) of the light reflecting plate 113.

The light reflecting plate 113 is separated from the shaft portions 12a and 12b in a plate thickness direction of the light reflecting plate 113, and is overlapped with a portion of the shaft portions 12a and 12b in the plate thickness direction of the light reflecting plate 113 (that is, a direction in which the light reflecting plate 113 and the base portion 111 are lined up) (hereinafter, simply referred to as "plan view"). Accordingly, even if the area of the plate surface of the light reflecting plate 113 is increased, the optical scanner 1 can be downsized.

According to the present embodiment, the light reflecting plate 113 has an ellipse or oval shape in the plan view. Accordingly, it is possible to effectively use the light reflecting surface 114 to reflect light.

The lower surface of the light reflecting plate 113 (the other surface, a surface on the base portion 111 side of the light reflecting plate 113) is fixed to the base portion 111 through the spacer 112.

The spacer 112 links (connects) the base portion 111 and the light reflecting plate 113, and separates the light reflecting plate 113 from the base portion 111 in the thickness direction of the light reflecting plate 113. Accordingly, in comparatively simple and highly precise dimensional accuracy, the light reflecting plate 113 can be separated from the base portion 111 in the thickness direction of the light reflecting plate 113. In addition, it is possible to swing the light reflecting plate 113 about the Y axis while preventing the light reflecting plate 113 from coming into contact with the shaft portions 12a and 12b, the frame body portion 13, and the shaft portions 14a, 14b, 14c, and 14d.

Especially, the spacer 112 can be provided so as to adjust the position of a center of gravity G of a structure formed with the base portion 111, the spacer 112, and the light reflecting plate 113. This point is described below in detail.

The base portion 111 is positioned on the inner side from the circumference of the light reflecting plate 113 in the plan view. If the base portion 111 can support the light reflecting plate 113 through the spacer 112, the area of the base portion 111 in the plan view is preferably small, if possible. Accordingly, the distance between the shaft portion 12a and the shaft portion 12b can be reduced while increasing the area of the plate surface of the light reflecting plate 113.

The frame body portion 13 has a frame shape, and is provided to surround the base portion 111 of the movable mirror portion 11. In other words, the base portion 111 of the movable mirror portion 11 is provided on the inner side of the frame body portion 13 having a frame shape.

The frame body portion 13 is supported by the supporting portion 15 through the shaft portions 14a, 14b, 14c, and 14d. The base portion 111 of the movable mirror portion 11 is supported by the frame body portion 13 through the shaft portions 12a and 12b.

The length of the frame body portion 13 in the Y axis is longer than that in the X axis. That is, if the length of the frame body portion 13 in the Y axis is a, and the length of the frame body portion 13 in the X axis is b, a relation of a>b is satisfied. Accordingly, the length of the optical scanner 1 in the X axis can be suppressed while securing the length required in the shaft portions 12a and 12b.

Further, the frame body portion 13 has a form in the plan view, along the external shape of the structure configured with the base portion 111 of the movable mirror portion 11 and the pair of shaft portions 12a and 12b. Accordingly, the frame body portion 13 can be downsized while allowing the vibration of the first vibration system to be configured with the movable mirror portion 11, and the pair of shaft portions 12a and 12b, that is, the swing of the movable mirror portion 11 about the Y axis.

Further, the shape of the frame body portion 13 is not limited to the shape illustrated in the drawings, as long as it has a frame shape.

The shaft portions 12a and 12b and the shaft portions 14a, 14b, 14c, and 14d can be respectively elastically deformed. Also, the shaft portions 12a and 12b link the movable mirror portion 11 and the frame body portion 13 so that the movable mirror portion 11 can swing (rotate) about the Y axis (first axis). In addition, the shaft portions 14a, 14b, 14c, and 14d link the frame body portion 13 and the supporting portion 15 so that the frame body portion 13 can swing (rotate) about the X axis (second axis) orthogonal to the Y axis.

The shaft portions 12a and 12b are arranged to face each other through the base portion 111 of the movable mirror portion 11. The shaft portions 12a and 12b respectively have longitudinal shapes extending in the Y axis. One ends of the shaft portions 12a and 12b are respectively connected to the base portion 111, and the other ends are connected to the frame body portion 13. The shaft portions 12a and 12b are arranged so that the respective central axes are identical to the Y axis.

The shaft portions 12a and 12b are respectively deformed in a distorted manner along with the swing of the movable mirror portion 11 about the Y axis.

The shaft portions 14a and 14b and the shaft portions 14c and 14d are arranged to face with each other through the frame body portion 13. The shaft portions 14a, 14b, 14c, and 14d respectively have longitudinal shapes extending in the X axis. One ends of the shaft portions 14a, 14b, 14c, and 14d are connected to the frame body portion 13, and the other ends are connected to the supporting portion 15. The shaft portions 14a and 14b are provided to face each other through the X axis, and the shaft portions 14c and 14d are provided to face each other through the X axis in the same manner.

With respect to the shaft portions 14a, 14b, 14c, and 14d, the entire shaft portions 14a and 14b and the entire shaft portions 14c and 14d are respectively deformed in a distorted manner following the swing of the frame body portion 13 about the X axis.

As described above, it is possible to swing (rotate) the movable mirror portion 11 (in other words, the light reflecting plate 113) about two axes of the X axis and the Y axis orthogonal to each other by swinging the movable mirror portion 11 about the Y axis and swinging the frame body portion 13 about the X axis.

The shapes of the shaft portions 12a and 12b and the shaft portions 14a, 14b, 14c, and 14d are not limited to the shapes described above, and, for example, may have a bended or curved portion or a diverged portion in at least one portion in the middle.

The base portion 111, the shaft portions 12a and 12b, the frame body portion 13, the shaft portions 14a, 14b, 14c, and 14d, and the supporting portion 15 described above are integrally formed.

According to the first embodiment, the base portion 111, the shaft portions 12a and 12b, the frame body portion 13, the shaft portions 14a, 14b, 14c, and 14d, and the supporting portion 15 are formed by etching an SOI substrate obtained by laminating a first Si layer (device layer), an $SiO_2$ layer (box layer), and a second Si layer (handle layer), in this sequence. Accordingly, it is possible to enhance the vibration characteristics of the first vibration system and the second vibration system. Further, since the refined process can be performed on the SOI substrate by etching, it is possible to enhance the dimensional accuracy by forming the base portion 111, the shaft portions 12a and 12b, the frame body portion 13, the shaft portions 14a, 14b, 14c, and 14d, and the supporting portion 15 by using the SOI substrate, and it is also possible to downsize the optical scanner 1.

The base portion 111, the shaft portions 12a and 12b, and the shaft portions 14a, 14b, 14c, and 14d can be respectively configured with the first Si layer of the SOI substrate. Accordingly, it is possible to enhance the elasticity of the shaft portions 12a and 12b and the shaft portions 14a, 14b, 14c, and 14d. Further, it is possible to prevent the base portion 111 from coming into contact with the frame body portion 13 when the base portion 111 is rotated about the Y axis.

The frame body portion 13 and the supporting portion 15 are respectively configured with a laminated body formed with the first Si layer, the $SiO_2$ layer, and the second Si layer of the SOI substrate. Accordingly, it is possible to enhance rigidity of the frame body portion 13 and the supporting portion 15. Further, the $SiO_2$ layer and the second Si layer of the frame body portion 13 have a function as a rib increasing the rigidity of the frame body portion 13, and also a function of preventing the movable mirror portion 11 from coming into contact with the permanent magnet 21.

Further, in the plan view, it is preferable to perform an antireflection process on the upper surface of the first shaft portion, the second shaft portion, the frame body portion 13, and the supporting portion 15 which are positioned on the outer side of the light reflecting plate 113. Accordingly, it is possible to prevent unnecessary light applied to portions other than the light reflecting plate 113 from becoming stray light.

The antireflection process is not particularly limited, and, for example, forming an antireflective film (multilayered dielectric film), a roughening treatment, and a black oxide treatment may be included.

Also, configuration materials and forming methods of the base portion 111, the shaft portions 12a and 12b, and the shaft portions 14a, 14b, 14c, and 14d are provided as examples, and the invention is not limited thereto.

According to the first embodiment, the spacer 112 and the light reflecting plate 113 are formed by etching the SOI substrate. The spacer 112 is configured with a laminated body formed with the $SiO_2$ layer and the second Si layer of the SOI substrate. The light reflecting plate 113 is configured with the first Si layer of the SOI substrate.

As described above, it is possible to simply and highly precisely manufacture the spacer 112 and the light reflecting plate 113 joined to each other by forming the spacer 112 and the light reflecting plate 113 using the SOI substrate.

The spacer 112 is joined to the base portion 111 by a joining material (not illustrated) such as a bonding agent and a brazing material.

The permanent magnet 21 is joined to the lower surface of the frame body portion 13 (on a surface opposite to the light reflecting plate 113) described above.

The method of joining the permanent magnet 21 and the frame body portion 13 is not particularly limited, but, for example, a joining method using a bonding agent can be used.

The permanent magnet 21 is magnetized in a direction of inclining to the X axis and the Y axis in the plan view.

According to the first embodiment, the permanent magnet 21 has a longitudinal shape (cylindrical shape) extending in a direction of inclining to the X axis and the Y axis. The permanent magnet 21 is magnetized in a longitudinal direction thereof. That is, the permanent magnet 21 is magnetized so that one end becomes an S pole, and the other end becomes an N pole.

Further, the permanent magnet 21 is disposed so as to be symmetrical with an intersecting point of the X axis and the Y axis to be the center, in the plan view.

In the first embodiment, a case in which one permanent magnet is disposed in the frame body portion 13 is described, but the invention is not limited to this, and, for example, two permanent magnets may be disposed in the frame body portion 13. In this case, two long permanent magnets are disposed in the frame body portion 13, so as to face each other through the base portion 111 and to be parallel to each other in the plan view.

An inclination angle θ of the permanent magnet 21 in the magnetization direction (extending direction) with the X axis is not particularly limited, but is preferably equal to or greater than 30° and equal to or less than 60°, more preferably equal to or greater than 45° and equal to or less than 60°, and still more preferably 45°. It is possible to smoothly and securely rotate the movable mirror portion 11 about the X axis by providing the permanent magnet 21.

In contrast, if the inclination angle θ is less than the lower limit, the movable mirror portion 11 may not be sufficiently rotated about the X axis according to various conditions of the strength of the voltage applied by the voltage application portion 4 to the coil 31, or the like. Meanwhile, if the inclination angle θ exceeds the upper limit, the movable mirror portion 11 may not sufficiently rotate about the Y axis according to various conditions.

As the permanent magnet 21, for example, a neodymium magnet, a ferrite magnet, a samarium-cobalt magnet, an alnico magnet, and a bonded magnet are preferably used. The permanent magnet 21 can be obtained by magnetizing a hard magnetic body, and for example, the permanent magnet 21 can be formed by providing an unmagnetized hard magnetic body in the frame body portion 13, and then magnetizing the hard magnetic body. This is because if the previously magnetized permanent magnet 21 is provided in the frame body portion 13, the permanent magnet 21 may not be provided in a desired position by influences from a magnetic field of the outside or other components.

The coil 31 is provided right below the permanent magnet 21. That is, the coil 31 is provided so as to face the lower surface of the frame body portion 13. Accordingly, the magnetic field generated from the coil 31 can be effectively applied to the permanent magnet 21. Further, the power saving and the downsizing of the optical scanner 1 can be achieved.

According to the first embodiment, the coil 31 is disposed so as to be wound around the magnetic core 32. Accordingly, the magnetic field generated in the coil 31 can be effectively applied to the permanent magnet 21. Further, the magnetic core 32 may be omitted.

The coil 31 is electrically connected to the voltage application portion 4. Also, the magnetic field having magnetic flux orthogonal to the X axis and the Y axis is generated from the coil 31 by applying the voltage to the coil 31 by the voltage application portion 4.

As illustrated in FIG. 3, the voltage application portion 4 includes a first voltage generating circuit 41 that generates a first voltage $V_1$ causing the movable mirror portion 11 to rotate about the Y axis, a second voltage generating circuit 42 that generates a second voltage $V_2$ causing the movable mirror portion 11 to rotate about the X axis, and a voltage superimposing portion 43 in which the first voltage $V_1$ and the second voltage $V_2$ are superimposed, and applies the voltages superimposed in the voltage superimposing portion 43 to the coil 31.

As illustrated in FIG. 4A, the first voltage generating circuit 41 generates the first voltage $V_1$ (horizontal scanning voltage) that periodically changes in a cycle $T_1$. That is, the first voltage generating circuit 41 generates the first voltage $V_1$ of a first frequency ($1/T_1$).

The first voltage $V_1$ has a waveform similar to a sine wave. Therefore, the optical scanner 1 can effectively perform main scanning with light. Further, the waveform of the first voltage $V_1$ is not limited thereto.

Further, the first frequency ($1/T_1$) is not particularly limited as long as it is a frequency appropriate for horizontal scanning, but is preferably 10 to 40 kHz.

According to the first embodiment, the first frequency is configured to be identical to the torsional resonance frequency (f1) of the first vibration system (torsional vibration system) configured with the movable mirror portion 11, and the pair of shaft portions 12a and 12b. That is, the first vibration system is designed (manufactured) so that the torsional resonance frequency f1 thereof can be the frequency appropriate for horizontal scanning. Accordingly, it is possible to increase the rotational angle of the movable mirror portion 11 about the Y axis.

Meanwhile, as illustrated in FIG. 4B, the second voltage generating circuit 42 generates the second voltage $V_2$ (vertical scanning voltage) that periodically changes in a cycle $T_2$ different from the cycle $T_1$. That is, the second voltage generating circuit 42 generates the second voltage $V_2$ of a second frequency ($1/T_2$).

The second voltage $V_2$ has a waveform similar to a sawtooth wave. Therefore, the optical scanner 1 can effectively perform the vertical scanning (subscanning) with light. Further, the waveform of the second voltage $V_2$ is not limited thereto.

The second frequency ($1/T_2$) is not particularly limited, as long as it is different from the first frequency ($1/T_1$), and is appropriate for the vertical scanning. However, the second frequency ($1/T_2$) is preferably 30 to 120 Hz (about 60 Hz). In this manner, it is possible to rotate the movable mirror portion 11 respectively about two axes (X axis and Y axis) orthogonal to each other at a frequency appropriate for drawing in a display by setting the frequency of the second voltage $V_2$ to be about 60 Hz, and the frequency of the first voltage $V_1$ to be 10 to 40 kHz. However, if the movable mirror portion 11 can rotate respectively about the axes of the X axis and the Y axis, the combination of the frequency of the first voltage $V_1$ and the frequency of the second voltage $V_2$ is not particularly limited.

According to the first embodiment, the frequency of the second voltage $V_2$ is adjusted so as to be a frequency different from the torsional resonance frequency (resonance frequency) of the second vibration system (torsional vibration system) configured with the movable mirror portion 11, the pair of shaft portions 12a and 12b, the frame body portion 13, the two pairs of shaft portions 14a, 14b, 14c, and 14d, and the permanent magnet 21.

The frequency of the second voltage $V_2$ (second frequency) is preferably smaller than the frequency (first frequency) of the first voltage $V_1$. That is, the cycle $T_2$ is preferably longer than the cycle $T_1$. Accordingly, it is possible to more securely and smoothly rotate the movable mirror portion 11 about the Y axis at the first frequency, and also about the X axis at the second frequency.

Further, if the torsional resonance frequency of the first vibration system is f1 [Hz], and the torsional resonance frequency of the second vibration system is f2 [Hz], f1 and f2 preferably satisfy the relationship of f2<f1, and more preferably satisfy the relationship of f1≥10f2. Accordingly, it is possible to more smoothly rotate the movable mirror portion 11 at the frequency of the second voltage $V_2$ about the X axis while rotating the movable mirror portion 11 at the frequency of the first voltage $V_1$ about the Y axis. In contrary, if f1 and f2 satisfy the relationship of f1≤f2, it is possible to generate the vibration of the first vibration system by the second frequency.

The first voltage generating circuit 41 and the second voltage generating circuit 42 are respectively connected to a control portion 7, and are driven based on signals from the control portion 7. The voltage superimposing portion 43 is connected to the first voltage generating circuit 41 and the second voltage generating circuit 42.

The voltage superimposing portion 43 includes an adder 43a for applying the voltage to the coil 31. The adder 43a receives the first voltage $V_1$ from the first voltage generating circuit 41, and also the second voltage $V_2$ of the second voltage generating circuit 42, and superimposes and applies these voltages to the coil 31.

Next, a method of driving the optical scanner 1 is described. Further, according to the first embodiment, as described above, the frequency of the first voltage $V_1$ is set to be identical to the torsional resonance frequency of the first vibration system, and the frequency of the second voltage $V_2$ is set to be a value different from the torsional resonance frequency of the second vibration system, and smaller than the frequency of the first voltage $V_1$ (for example, the frequency of the first voltage $V_1$ is set to be 18 kHz, and the frequency of the second voltage $V_2$ is set to be 60 Hz).

For example, the optical scanner 1 superimposes the first voltage $V_1$ illustrated in FIG. 4A and the second voltage $V_2$ illustrated in FIG. 4B in the voltage superimposing portion 43, and applies the superimposed voltage to the coil 31.

Then, a magnetic field (the magnetic field is referred to as "a magnetic field A1") that attracts one end portion (N pole) of the permanent magnet 21 to the coil 31 by the first voltage $V_1$ and separates the other end portion (S pole) of the permanent magnet 21 from the coil 31 and a magnetic field (the magnetic field is referred to as "a magnetic field A2") that separates one end portion (N pole) of the permanent magnet 21 from the coil 31 and also attracts the other end portion (S pole) of the permanent magnet 21 to the coil 31 are alternately switched.

Here, as described above, the permanent magnet 21 is arranged so that the respective end portions (magnetic poles) are positioned in two regions partitioned by the Y axis. That is, in the plan view of FIG. 1, the N pole of the permanent magnet 21 is positioned on one side with the Y axis interposed therebetween, and the S pole of the permanent magnet 21 is positioned on the other side. Therefore, the vibrations having vibration components around the Y axis are excited in the frame body portion 13 by alternately switching the magnetic field A1 and the magnetic field A2, the shaft portions 12a and 12b are deformed in a distorted manner along with the vibrations, and the movable mirror portion 11 is rotated about the Y axis at the frequency of the first voltage $V_1$.

Further, the frequency of the first voltage $V_1$ is identical to the torsional resonance frequency of the first vibration system. Therefore, the movable mirror portion 11 can be effectively rotated about the Y axis by the first voltage $V_1$. That is, even if the vibrations having the vibration components around the Y axis of the frame body portion 13 are small, it is possible to increase the rotational angle of the movable mirror portion 11 about the Y axis followed by the vibrations.

Meanwhile, a magnetic field (the magnetic field is referred to as "a magnetic field B1") that attracts one end portion (N pole) of the permanent magnet 21 to the coil 31 by the second voltage $V_2$ and separates the other end portion (S pole) of the permanent magnet 21 from the coil 31 and a magnetic field (the magnetic field is referred to as "a magnetic field B2") that separates one end portion (N pole) of the permanent magnet 21 from the coil 31 and attracts the other end portion (S pole) of the permanent magnet 21 to the coil 31 are alternately switched.

Here, as described above, the permanent magnet 21 is arranged so that the end portions (magnetic poles) are respectively positioned in the two regions partitioned by the X axis. That is, in the plan view of FIG. 1, the N pole of the permanent magnet 21 is positioned on one side with the X axis interposed therebetween, and the S pole of the permanent magnet 21 is positioned on the other side. Therefore, the shaft portions 14a and 14b and the shaft portions 14c and 14d are respectively deformed in a distorted manner by alternately switching the magnetic field B1 and the magnetic field B2, and the frame body portion 13 is rotated about the X axis together with the movable mirror portion 11 at the frequency of the second voltage $V_2$.

Further, the frequency of the second voltage $V_2$ is set to be extremely lower than the frequency of the first voltage $V_1$. In addition, the torsional resonance frequency of the second vibration system is designed to be lower than the torsional resonance frequency of the first vibration system. Therefore, it is possible to prevent the movable mirror portion 11 from being rotated about the Y axis at the frequency of the second voltage $V_2$.

As described above, the movable mirror portion 11 can be rotated about the Y axis at the frequency of the first voltage $V_1$ and about the X axis at the frequency of the second voltage $V_2$ by applying the voltage obtained by superimposing the first voltage $V_1$ and the second voltage $V_2$ to the coil 31. Accordingly, it is possible to achieve the power saving and the downsizing of the apparatus, and to rotate the movable mirror portion 11 respectively about the axes of the X axis and the Y axis by the electromagnetic driving method (moving magnet type method). Specifically, it is possible to excite the vibrations having the vibration components around the Y axis of the frame body portion 13 without applying direct driving power to the base portion 111 or the light reflecting plate 113, and to swing the light reflecting plate 113 about the Y axis along with the vibrations. Therefore, compared to the case in which driving sources are provided respectively to the base portion 111 and the frame body portion 13, it is possible to reduce the number of components (permanent magnet and coil) that configure the driving sources. Therefore, a simple and small configuration can be achieved. Further, since the coil 31 is separated from the vibration system of the optical scanner 1, it is possible to prevent an adverse effect on the vibration system caused by the generation of heat by the coil 31.

Such movements of the movable mirror portion 11 are detected based on detected signals of the distortion detection elements 51 and 52.

The distortion detection element 51 (first distortion detection element) detects the deformation of the shaft portion 12b (mainly, distorted deformation). The detection signals of the distortion detection element 51 include signals based on the distorted deformation of the shaft portion 12b. Accordingly, the movements of the movable mirror portion 11 about the Y axis can be detected based on the detection signals of the distortion detection element 51.

Meanwhile, the distortion detection element 52 (second distortion detection element) detects the deformation of the shaft portion 14d (mainly, bent deformation). The detection signals of the distortion detection element 52 include signals based on the distorted deformation of the entire shaft portions 14c and 14d. Therefore, the movements of the movable mirror portion 11 and the frame body portion 13 about the X axis can be detected based on the detection signals of the distortion detection element 52.

The distortion detection elements 51 and 52 are 2-terminal-type or 4-terminal-type piezoresistive elements, respectively. The piezoresistive region included in the piezoresistive element is formed by doping impurities such as phosphorus or boron on the surface of the shaft portion 12b or the supporting portion 15.

The distortion detection elements 51 and 52 are electrically connected to the control portion 7 through wiring (not illustrated). Also, the control portion 7 controls the driving of the voltage application portion 4 based on the detection signals of the distortion detection elements 51 and 52.

Here, the light reflecting plate 113 is described with reference to FIGS. 5 to 7B.

Figure 5:
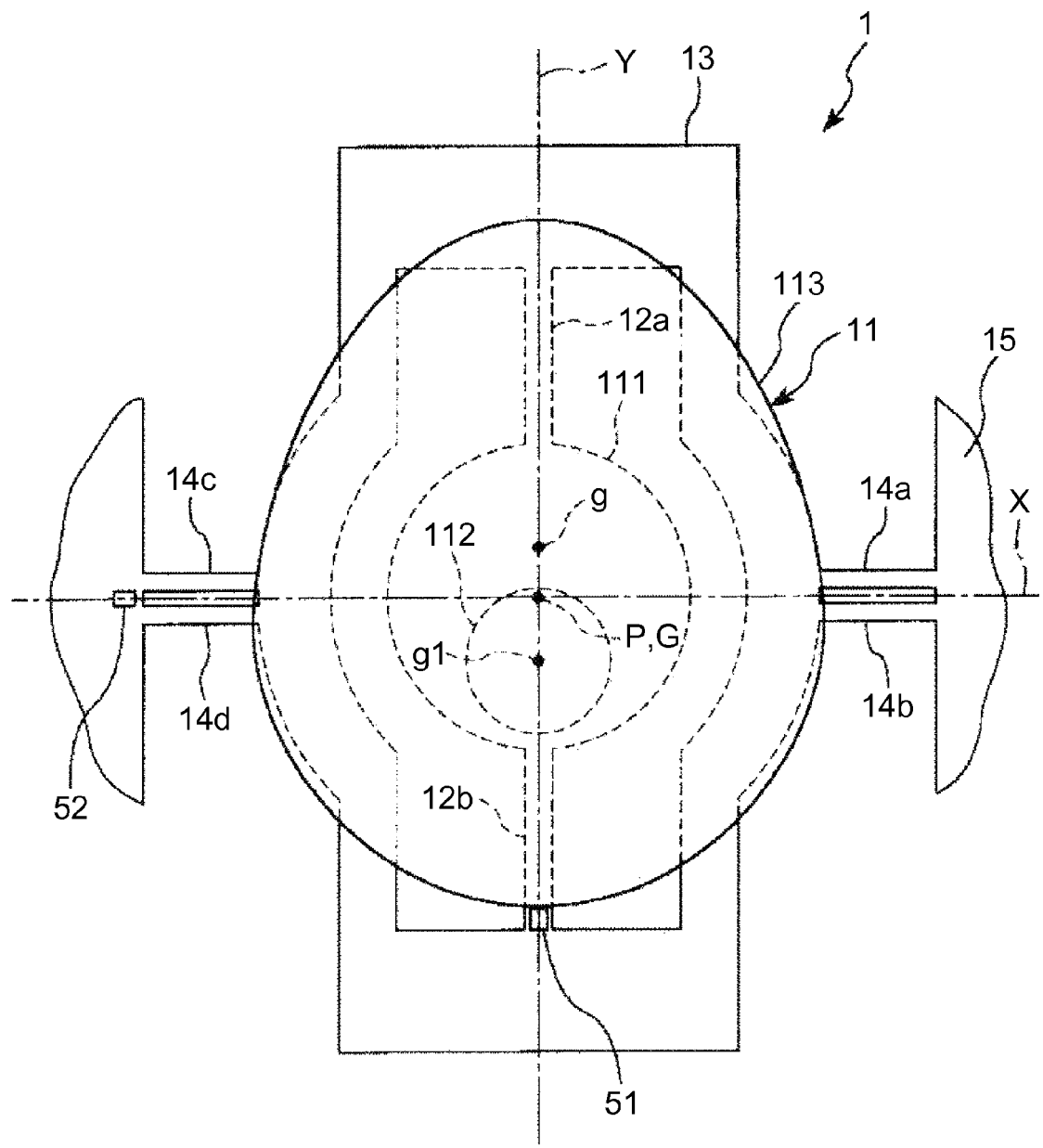
FIG. 5 is a plan view illustrating a light reflecting plate, a base portion, and a connection portion included in the optical scanner illustrated in FIG. 1.
Figure 6A:
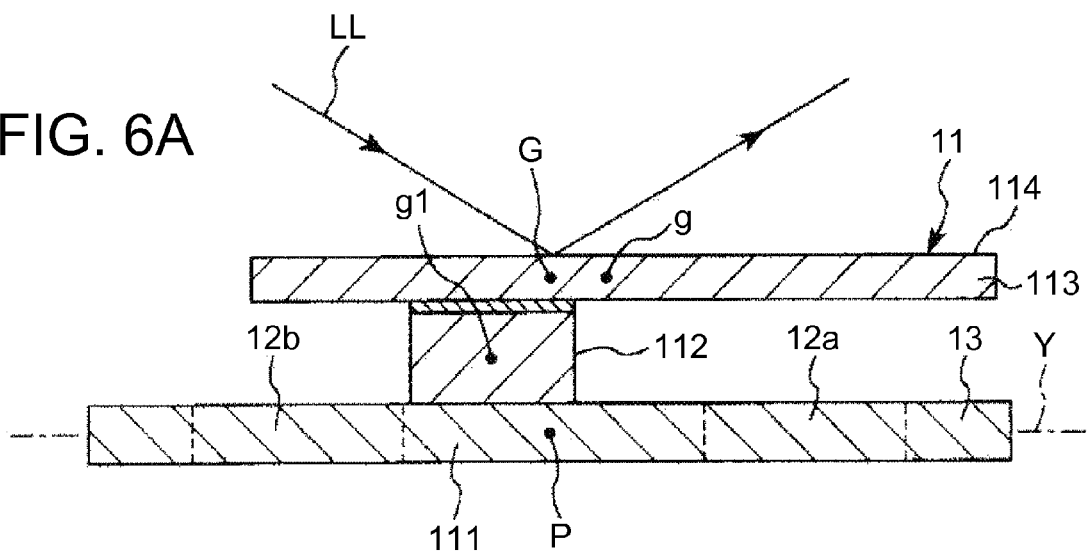
Figure 6B:
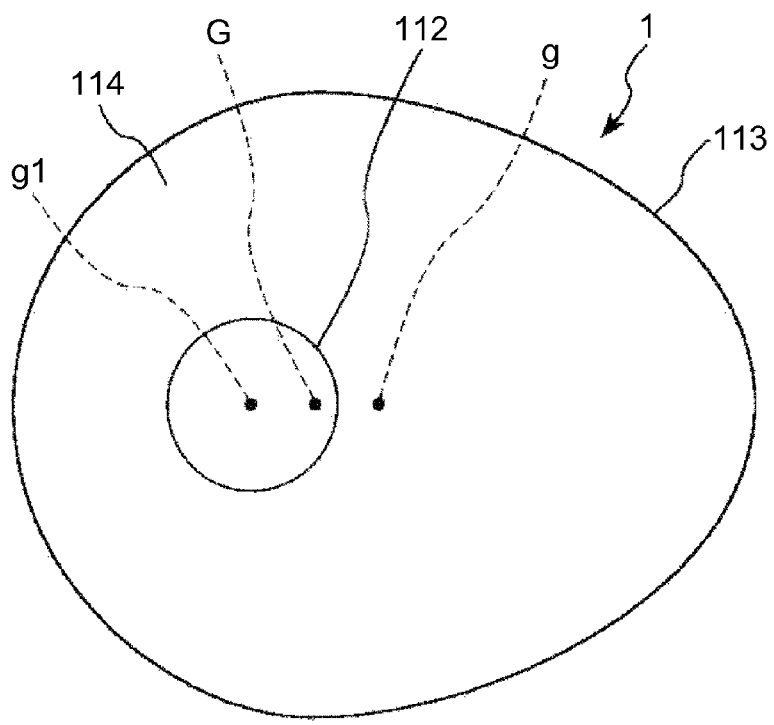
Figure 7A:
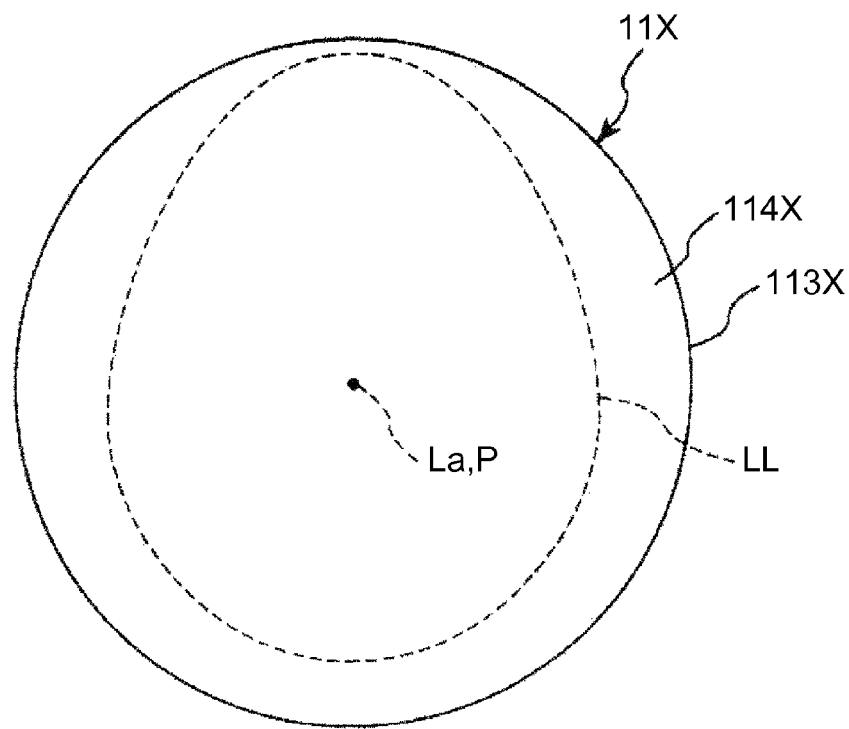
FIG. 7A is a diagram illustrating utilization efficiency of light of the light reflecting plate in the related art.
Figure 7B:
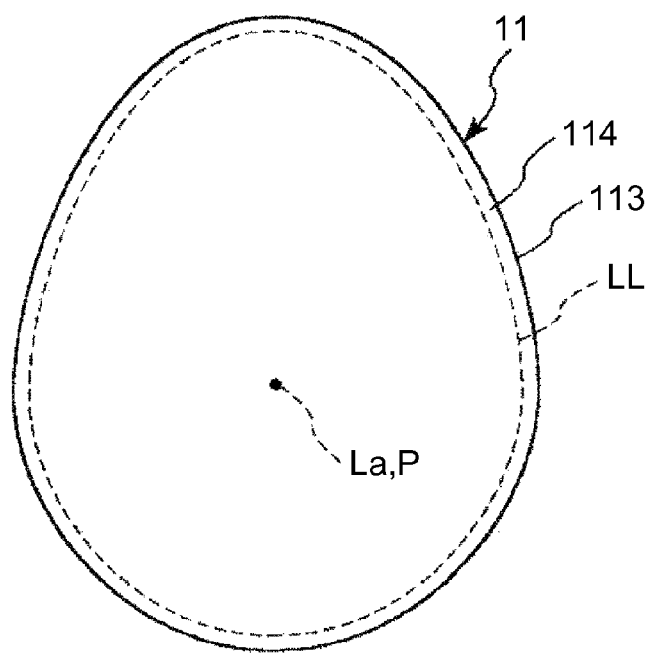
FIG. 7B is a diagram illustrating the utilization efficiency of light of the light reflecting plate included in the optical scanner illustrated in FIG. 1.

FIG. 5 is a plan view illustrating the light reflecting plate, the base portion, and the connection portion included in the optical scanner illustrated in FIG. 1. FIGS. 6A and 6B are diagrams illustrating the light reflecting plate and the connection portion included in the optical scanner illustrated in FIG. 1, of which FIG. 6A is a cross-sectional view taken along the Y axis, and FIG. 6B is a rear view illustrating the light reflecting plate. Further, FIG. 7A is a diagram illustrating utilization efficiency of light of the light reflecting plate in the related art, and FIG. 7B is a diagram illustrating the utilization efficiency of light of the light reflecting plate included in the optical scanner illustrated in FIG. 1.

As illustrated in FIG. 5, the light reflecting plate 113 is provided so that a geometrical center g of the light reflecting plate 113 becomes a position far from the X axis in the plan view. Also, a geometrical center g1 of the spacer 112 is positioned on the opposite side of the geometrical center g of the light reflecting plate 113 with respect to the X axis in the plan view. Accordingly, it is possible to set the center of gravity G of the movable mirror portion 11 configured with the base portion 111, the light reflecting plate 113, and the spacer 112 to come close to the X axis.

According to the first embodiment, the center of gravity G of the movable mirror portion 11 is identical to an intersecting point P of the X axis and the Y axis in the plan view. That is, the spacer 112 adjusts the center of gravity G of the movable mirror portion 11 so that the center of gravity G of the movable mirror portion 11 is identical to the intersecting point P between the X axis and the Y axis in the plan view.

Here, the geometrical center g of the light reflecting plate 113 is the geometric center of gravity in the plan view shape of the light reflecting plate 113. The geometrical center g1 of the spacer 112 is the geometric center of gravity in the plan view shape of the spacer 112. Also, the center of gravity G of the movable mirror portion 11 is the physical center of gravity (center of mass) of the movable mirror portion 11.

It is possible to enhance the balance of the moment of inertia about the swing axis (the X axis and the Y axis) of the movable mirror portion 11, and it is possible to form the light reflecting plate 113 to have a plan view shape with a small unnecessary region which is not used in the light reflection (having high utilization efficiency of light reflection) by adjusting the center of gravity G of the movable mirror portion 11.

As illustrated in FIG. 6A, though light LL is generally caused to be incident in a direction inclined to the light reflecting surface 114 of the light reflecting plate 113, especially in the biaxial-type optical scanner 1 in which the light reflecting plate 113 swings about two axes as described above, the light LL has to be incident to the light reflecting plate 113 so that highly precise light scanning is performed and an axis La of the light LL is identical to the intersecting point P between the X axis and the Y axis in the plan view.

As illustrated in FIG. 7A, when a movable mirror portion 11X including a circular light reflecting plate 113X in the related art is used, if the light LL is incident in the direction inclined to a light reflecting surface 114X of the light reflecting plate 113X so that the axis La of the light LL is identical to the intersecting point P between the X axis and the Y axis in the plan view, the light reflecting surface 114X is caused to have a large unnecessary region which is not used in the light reflection. The unnecessary region undesirably increases the area of the light reflecting surface 114X and the area and the volume of the light reflecting plate 113X, so that the air resistance when the light reflecting plate 113X swings is increased. As a result, the electric power consumption is increased. Also, since the mass of the light reflecting plate 113X is unnecessarily increased, this also causes an increase of the electric power consumption.

Therefore, as illustrated in FIG. 7B, the light reflecting plate 113 is formed to have a plan view shape in which an unnecessary region which is not used in the light reflection is small. Here, in the plan view, the light reflecting plate 113 is positioned so that the geometrical center g of the light reflecting plate 113 is separated from the X axis and the intersecting point P (see FIG. 6B).

According to the first embodiment, the light reflecting plate 113 has an elliptical shape or the oval shape along the Y axis in the plan view. Accordingly, when the light is incident in the direction inclined to the light reflecting surface 114 of the light reflecting plate 113, it is possible to decrease the unnecessary region which is not used in the light reflection of the light reflecting plate 113.

In the biaxial-type optical scanner 1, if the balance of the moment of inertia about the swing axes (X axis or Y axis) of the movable mirror portion 11 is poor, the balance of the swinging angle of the light reflecting plate 113 becomes poor, and also undesirably bent deformation occurs in the shaft portion 12a or 12b or the shaft portion 14a, 14b, 14c, or 14d.

More specifically, according to the first embodiment, the geometrical center g of the light reflecting plate 113 is deviated from the Y axis. However, if the center of gravity is not adjusted, the balance of the moment of inertia about the X axis of the movable mirror portion 11 becomes poor, and the balance of the swinging angle about the X axis of the light reflecting plate 113 becomes poor. That is, if the center of gravity of the movable mirror portion 11 is not adjusted, the center of gravity G of the movable mirror portion 11 is deviated from the X axis in the plan view, and when the light reflecting plate 113 swings about the X axis, the swinging angle of the portion on the geometrical center g side of the light reflecting plate 113 and the swinging angle of the portion on the other side with respect to the X axis become different from each other.

Further, as described above, if the light reflecting plate 113 is separated from the shaft portions 12a and 12b in the plate thickness direction of the light reflecting plate 113, the center of gravity G of the movable mirror portion 11 is separated from the Y axis in the thickness direction of the light reflecting plate 113. Accordingly, if the center of gravity of the movable mirror portion 11 is not adjusted, undesirably bent deformation occurs in the shaft portion 14a, 14b, 14c, or 14d according to the swing of the light reflecting plate 113 about the Y axis. That is, if the center of gravity G of the movable mirror portion 11 is deviated from the X axis in the plan view, when the light reflecting plate 113 swings about the Y axis, the force that causes the base portion 111 to rotate about the axis orthogonal to the X axis and the Y axis is applied to the base portion 111. As a result, the undesirably bent deformation occurs in the shaft portion 12a or 12b, or the shaft portion 14a, 14b, 14c, or 14d.

Accordingly, in the biaxial-type optical scanner 1, it is particularly effective to adjust the center of gravity of the movable mirror portion 11. That is, it is possible to prevent or suppress the unnecessary problems described above from occurring by adjusting the center of gravity G of the movable mirror portion 11.

Further, as described above, the geometrical center g1 of the spacer 112 is deviated from the X axis in the plan view. As described above, the spacer 112 can be collectively formed together with the light reflecting plate 113. Therefore, it is possible to suppress the positional relationship between the geometrical center g of the light reflecting plate 113 and the geometrical center g1 of the spacer 112 from varying for each item.

According to the first embodiment, the spacer 112 is circular in the plan view. Further, the plan view shape of the spacer 112 is not limited to this, and for example, may be rectangular, elliptical, or the like.

In the optical scanner 1 described above, it is possible to improve the balance of the moment of inertia about the swing axis of the movable mirror portion 11, and also to form the light reflecting plate 113 to have the plan view shape with high utilization efficiency of the light reflection by deviating from the geometrical center g1 of the spacer 112 to the opposite side of the geometrical center g of the light reflecting plate 113 with respect to the X axis in the plan view.

Second Embodiment

Subsequently, a second embodiment of the invention is described.

Figure 8A:
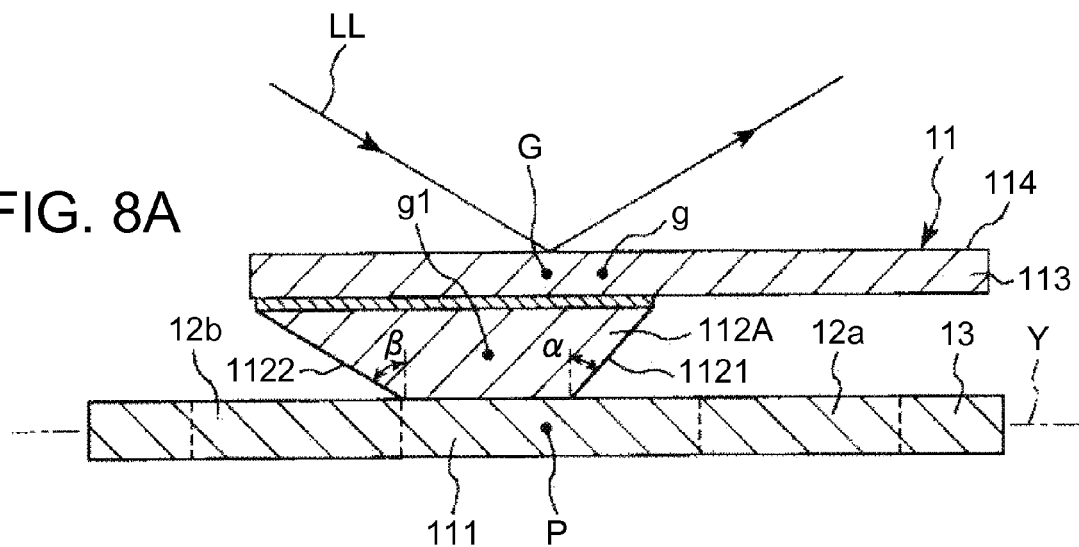
Figure 8B:
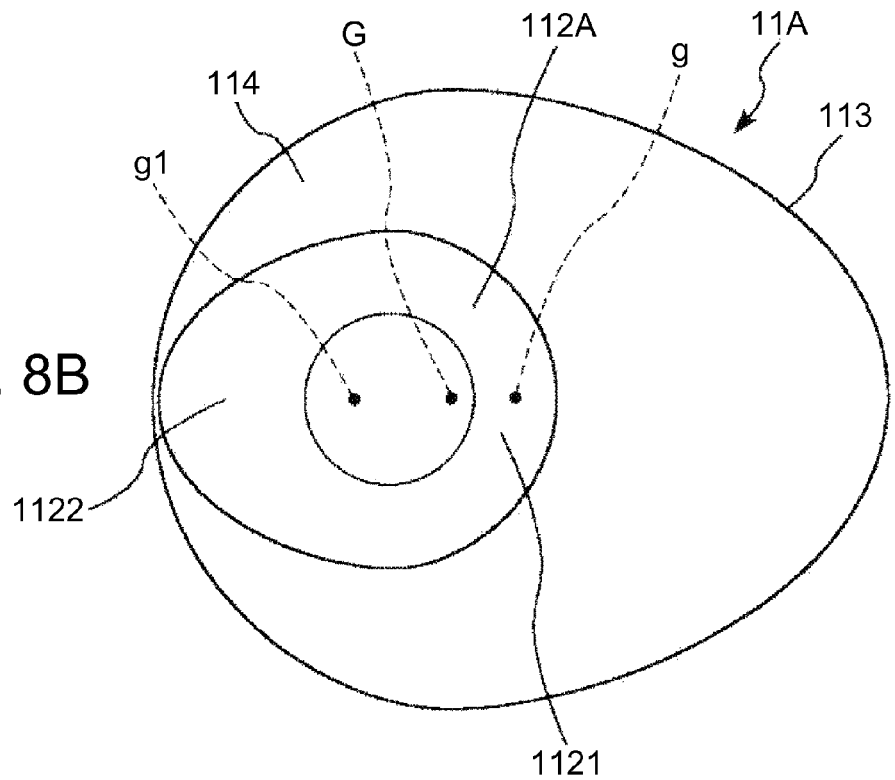

FIGS. 8A and 8B are diagrams illustrating a light reflecting plate and a connection portion included in an optical scanner according to the second embodiment of the invention, of which FIG. 8A is a cross-sectional view taken along the Y axis, and FIG. 8B is a rear view of the light reflecting plate.

Hereinafter, the second embodiment is described with respect to the difference from the first embodiment described above, and detailed descriptions of the same matters are omitted. Further, in FIGS. 8A and 8B, configurations the same as the first embodiment are denoted by the same reference numerals.

The second embodiment is the same as the first embodiment except that the configuration of the connection portion is different.

As illustrated in FIGS. 8A and 8B, a movable mirror portion 11A included in the optical scanner according to the second embodiment includes a spacer 112A (connection portion) that connects the light reflecting plate 113 and the base portion 111.

A taper inclined in a direction in which the light reflecting plate 113 and the base portion 111 are lined up is formed on the side surface of the spacer 112A. The taper is formed so that the width of the spacer 112A expands as it goes from the base portion 111 side to the light reflecting plate 113 side. Accordingly, it is possible to effectively adjust the balance of the mass formed with the base portion 111, the light reflecting plate 113, and the spacer 112A, that is, the balance of the moment of inertia of the movable mirror portion 11A about the X axis.

A proximal portion 1121 and a distal portion 1122 are respectively tapered with respect to the X axis, and inclination angular degrees of the proximal portion 1121 and the distal portion 1122 in the direction in which the light reflecting plate 113 and the base portion 111 are lined up are different from each other. More specifically, an inclination angular degree $\beta$ of the distal portion 1122 is greater than an inclination angular degree $\alpha$ of the proximal portion 1121. Accordingly, it is possible to effectively adjust the balance of the moment of inertia in the mass formed with the base portion 111, the light reflecting plate 113, and the spacer 112A about the X axis.

According to the second embodiment as described above, it is possible to improve the balance of the moment of inertia about the swing axis of the light reflecting portion, to realize the stable swing of the light reflecting portion, and to form the light reflecting portion to have the plan view shape with high utilization efficiency of the light reflection.

Third Embodiment

Subsequently, a third embodiment of the invention is described.

Figure 9:
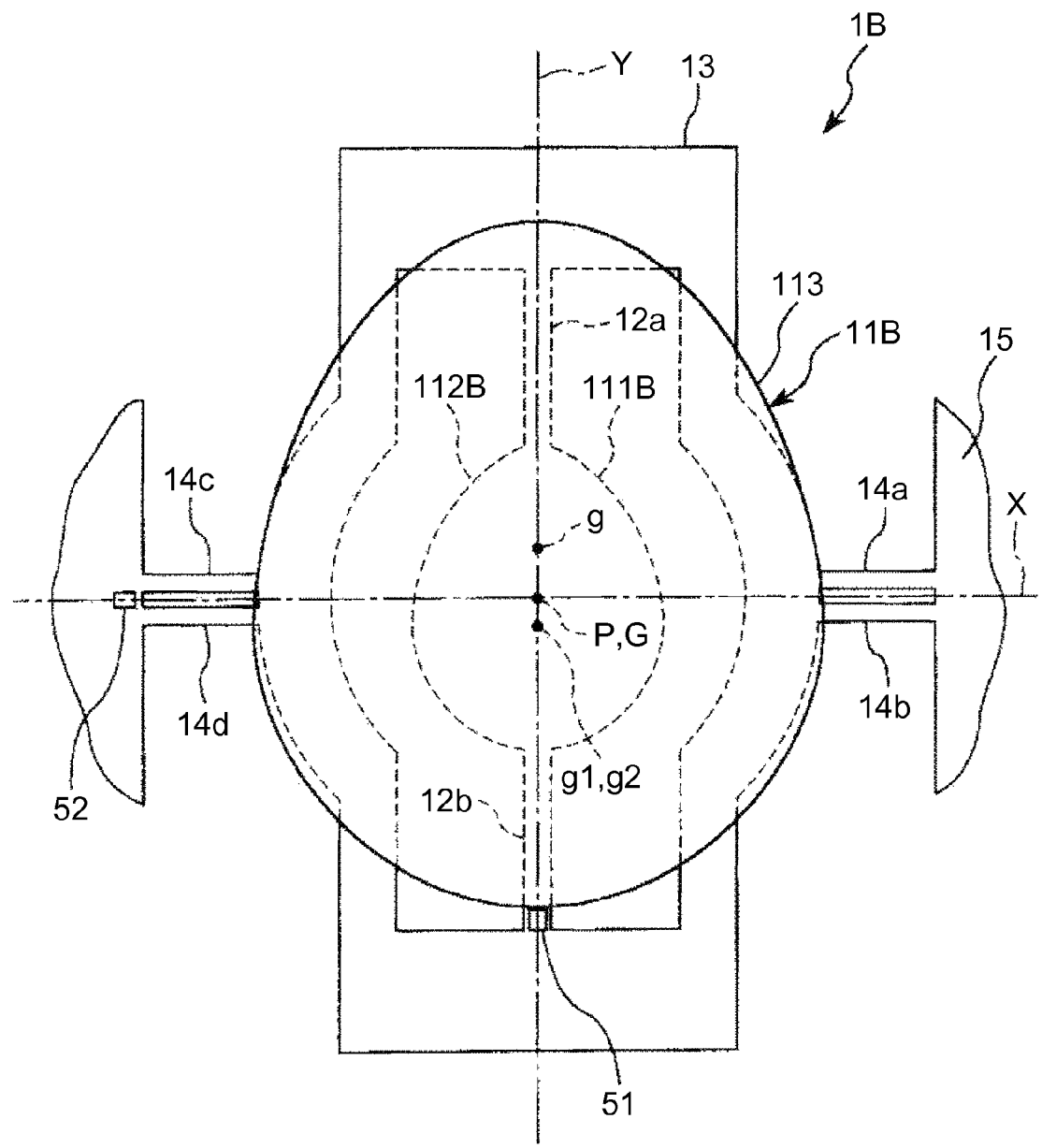
FIG. 9 is a plan view illustrating a light reflecting plate, a base portion, and a connection portion included in an optical scanner according to a third embodiment of the invention.

FIG. 9 is a plan view illustrating a light reflecting plate, a base portion, and a connection portion included in an optical scanner according to the third embodiment of the invention.

Hereinafter, the third embodiment is described with respect to the difference from the first embodiment described above, and detailed descriptions of the same matters are omitted. Further, in FIG. 9, configurations the same as the above embodiments are denoted by the same reference numerals.

The third embodiment is the same as the first embodiment except that a forming position of a center of gravity adjusting portion is different.

As illustrated in FIG. 9, a movable mirror portion 11B included in the optical scanner according to the third embodiment includes a base portion 111B supported by the shaft portions 12a and 12b, and a spacer 112B (connection portion) that connects the base portion 111B and the light reflecting plate 113.

According to the third embodiment, in the plan view, a geometrical center g2 of the base portion 111B and the geometrical center g1 of the spacer 112B are positioned on the opposite side of the geometrical center g of the light reflecting plate 113 with respect to the X axis.

Here, the base portion 111B is formed so that the geometrical center g2 of the base portion 111B is deviated from the X axis in the plan view. The base portion 111B can be collectively formed together with the frame body portion 13, the shaft portions 12a, 12b, 14a, 14b, 14c, and 14d, and the like. Therefore, it is possible to reduce variation in each item of the geometrical center g2 of the base portion 111B.

In the plan view, the geometrical centers g1 and g2 of the base portion 111B and the spacer 112B are deviated from the X axis. Accordingly, it is possible to effectively adjust the balance of the mass formed with the base portion 111B, the light reflecting plate 113, and the spacer 112B, that is, the balance of the moment of inertia of the movable mirror portion 11B about the X axis.

Further, in the plan view, the shape of the base portion 111B is identical to the shape of the spacer 112B. Accordingly, when the base portion 111B and the spacer 112B are connected, the positions are easily determined.

According to the third embodiment as described above, it is possible to improve the balance of the moment of inertia about the swing axis of the light reflecting portion, to realize the stable swing of the light reflecting portion, and to form the light reflecting portion to have the plan view shape with high utilization efficiency of the light reflection.

Fourth Embodiment

Subsequently, a fourth embodiment of the invention is described.

Figure 10:
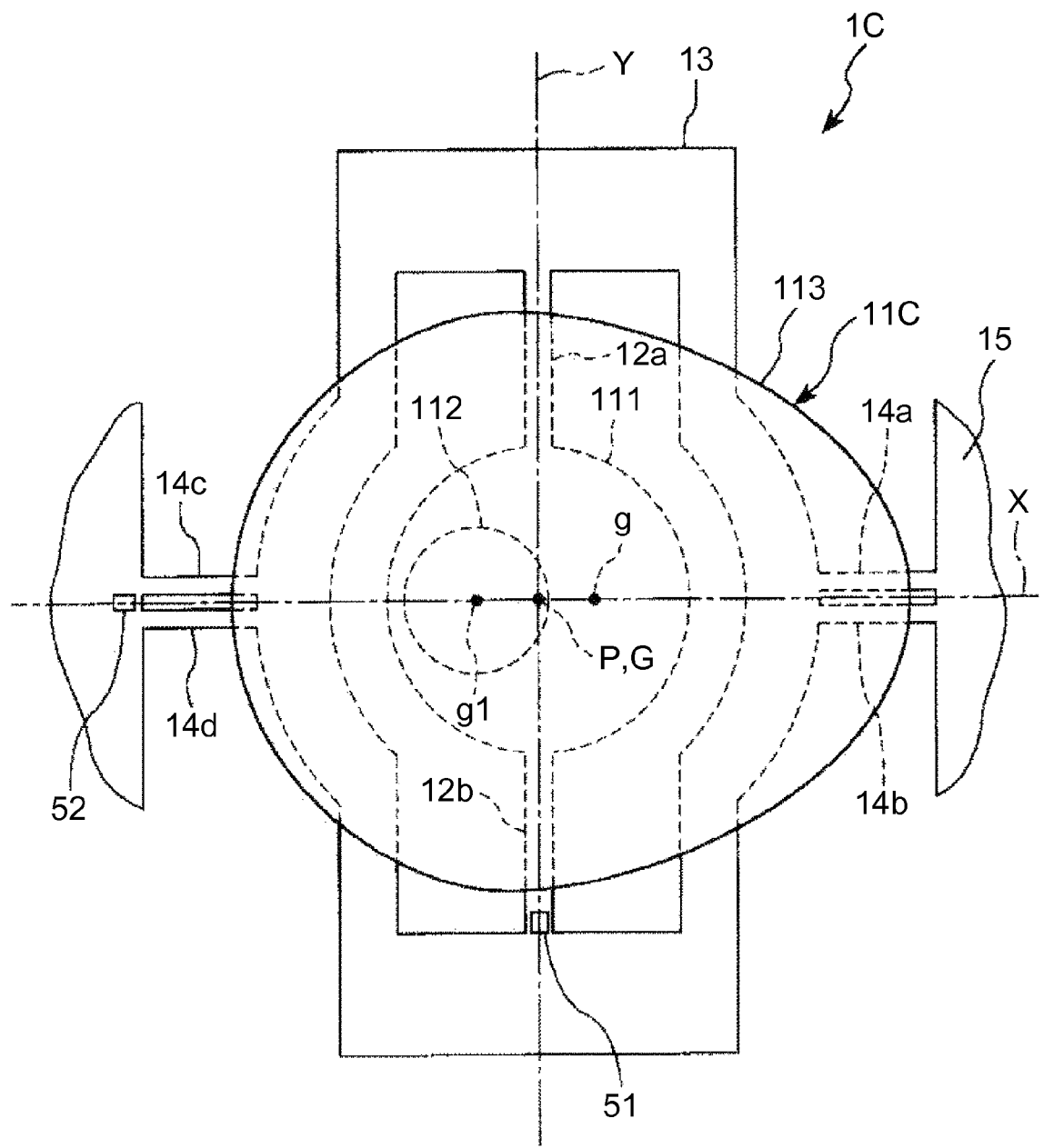
FIG. 10 is a plan view illustrating a light reflecting plate, a base portion, and a connection portion included in an optical scanner according to a fourth embodiment of the invention.

FIG. 10 is a plan view illustrating a light reflecting plate, a base portion, and a connection portion included in an optical scanner according to the fourth embodiment of the invention.

Hereinafter, the fourth embodiment is described with respect to the difference from the first embodiment described above, and detailed descriptions of the same matters are omitted. Further, in FIG. 10, configurations the same as the above embodiments are denoted by the same reference numerals.

The fourth embodiment is the same as the first embodiment except that the disposing orientation of the light reflecting plate is different.

As illustrated in FIG. 10, an optical scanner 1C according to the fourth embodiment is formed so that the geometrical center g of the light reflecting plate 113 is deviated from the Y axis in the plan view.

In this case, if the center of gravity is not adjusted, the balance of the moment of inertia of the movable mirror portion 11 about the Y axis becomes poor. Therefore, there is a problem in that the balance of the swinging angle of the movable mirror portion 11 about the Y axis becomes poor, and undesirably bent deformation of the shaft portions 12a and 12b occurs according to the swing of the movable mirror portion 11 about the X axis.

Here, in the plan view, the geometrical center g1 of the spacer 112 is positioned on the opposite side of the geometrical center g of the light reflecting plate 113 with respect to the Y axis. Accordingly, the center of gravity of the movable mirror portion 11 is adjusted, and the occurrence of the problem is prevented and suppressed.

According to the fourth embodiment described above, the balance of the moment of inertia of the light reflecting portion about the swing axis is improved, so that the stable swing of the light reflecting portion is realized, and the light reflecting portion can be formed to have the plan view shape in which the utilization efficiency of the light reflection is high.

Fifth Embodiment

Subsequently, a fifth embodiment of the invention is described.

Figure 11:
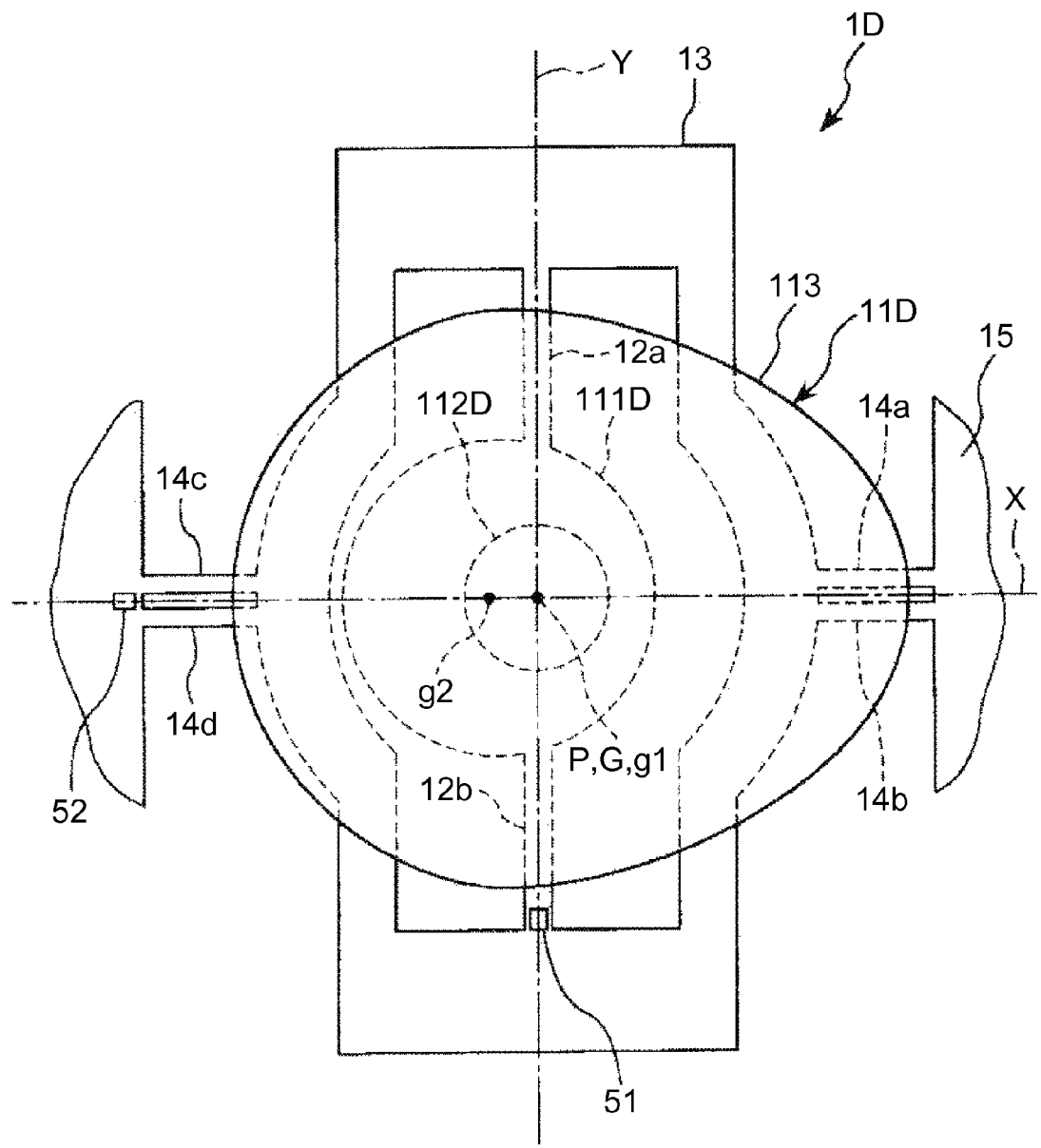
FIG. 11 is a plan view illustrating a light reflecting plate, a base portion, and a connection portion included in an optical scanner according to a fifth embodiment of the invention.

FIG. 11 is a plan view illustrating a light reflecting plate, a base portion, and a connection portion included in an optical scanner according to the fifth embodiment of the invention.

Hereinafter, the fifth embodiment is described with respect to the difference from the first embodiment described above, and detailed descriptions of the same matters are omitted. Further, in FIG. 11, configurations the same as the above embodiments are denoted by the same reference numerals.

The fifth embodiment is the same as the first embodiment except that the configuration of the base portion, the arrangement of the connection portion, and the disposing orientation of the light reflecting plate are different.

An optical scanner 1D illustrated in FIG. 11 includes a base portion 111D supported by the shaft portions 12a and 12b, and a spacer 112D (connection portion) that connects the base portion 111D and the light reflecting plate 113.

In the optical scanner 1D, the geometrical center g of the light reflecting plate 113 is deviated from the Y axis in the plan view, and the geometrical center g2 of the base portion 111D is positioned on the opposite side of the geometrical center g of the light reflecting plate 113 with respect to the Y axis in the plan view. Accordingly, the center of gravity of a movable mirror portion 11D can be adjusted.

Further, in the fifth embodiment, the geometrical center g1 of the spacer 112D is identical to the intersecting point P in the plan view.

According to the fifth embodiment described above, the balance of the moment of inertia of the light reflecting portion about the swing axis is improved, so that the stable swing of the light reflecting portion is realized, and the light reflecting portion can be formed to have the plan view shape in which the utilization efficiency of the light reflection is high.

Sixth Embodiment

Subsequently, a sixth embodiment of the invention is described.

Figure 12:
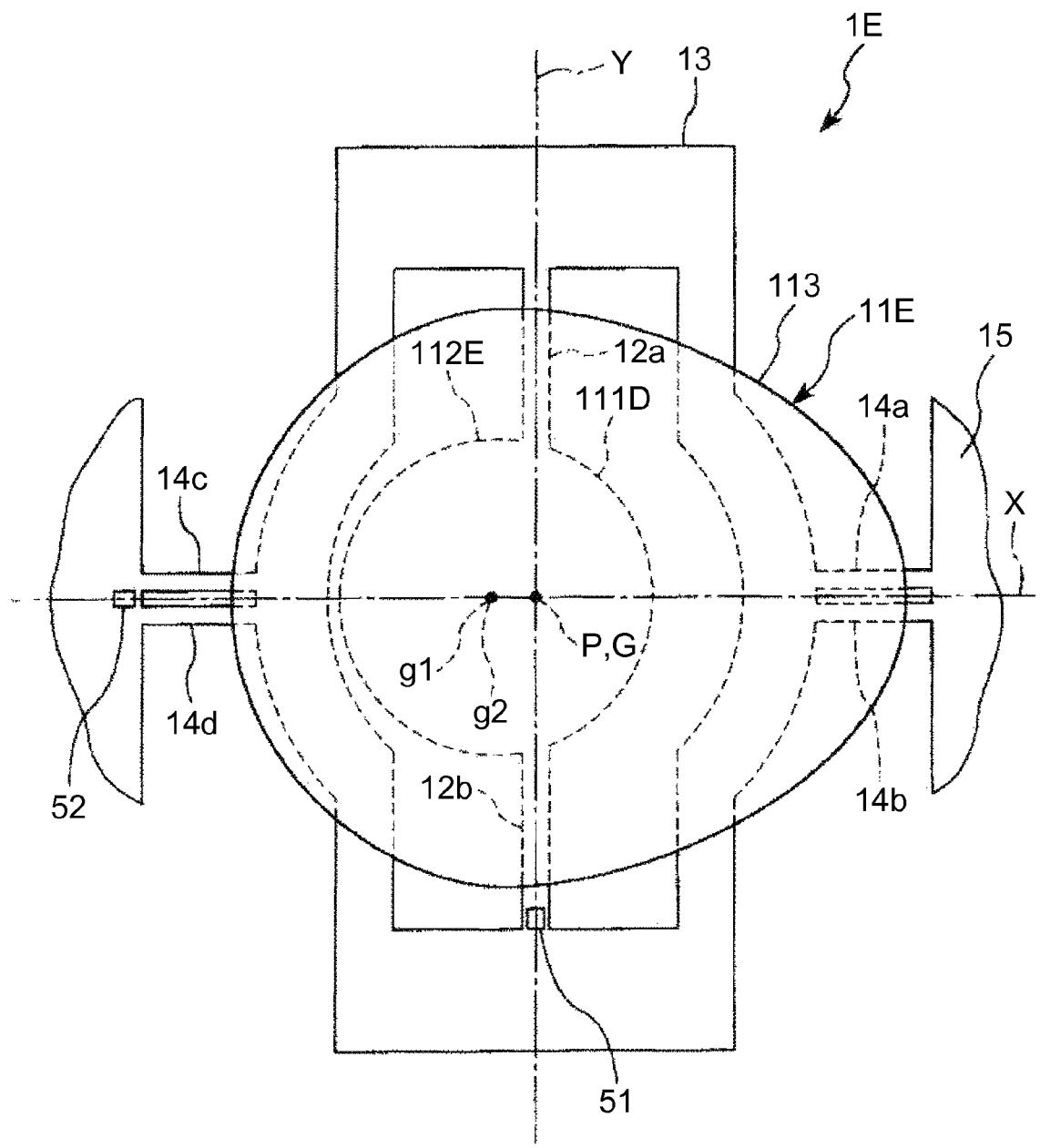
FIG. 12 is a plan view illustrating a light reflecting plate, a base portion, and a connection portion included in an optical scanner according to a sixth embodiment of the invention.

FIG. 12 is a plan view illustrating a light reflecting plate, a base portion, and a connection portion included in an optical scanner according to the sixth embodiment of the invention.

Hereinafter, the sixth embodiment is described with respect to the difference from the first embodiment described above, and detailed descriptions of the same matters are omitted. Further, in FIG. 12, configurations the same as the above embodiments are denoted by the same reference numerals.

The sixth embodiment is the same as the first embodiment except that the configurations of the base portion and the connection portion, and the disposing orientation of the light reflecting plate are different.

An optical scanner 1E illustrated in FIG. 12 includes the base portion 111D supported by the shaft portions 12a and 12b, and a spacer 112E (connection portion) that connects the base portion 111D and the light reflecting plate 113.

In the optical scanner 1D, the geometrical center g of the light reflecting plate 113 is deviated from the Y axis in the plan view, and the geometrical center g2 of the base portion 111D is positioned on the opposite side of the geometrical center g of the light reflecting plate 113 with respect to the Y axis in the plan view. Further, the geometrical center g1 of the spacer 112E is also positioned on the opposite side of the geometrical center g of the light reflecting plate 113 with respect to the Y axis in the plan view. Accordingly, it is possible to adjust the center of gravity of a movable mirror portion 11E.

In the sixth embodiment, the shape of the base portion 111D is identical to the shape of the spacer 112E in the plan view. Accordingly, when the base portion 111D and the spacer 112E are connected, the positions are easily determined.

According to the sixth embodiment described above, the balance of the moment of inertia of the light reflecting portion about the swing axis is improved, so that the stable swing of the light reflecting portion is realized, and the light reflecting portion can be formed to have the plan view shape in which the utilization efficiency of the light reflection is high.

Embodiment of Image Display Apparatus

Figure 13:
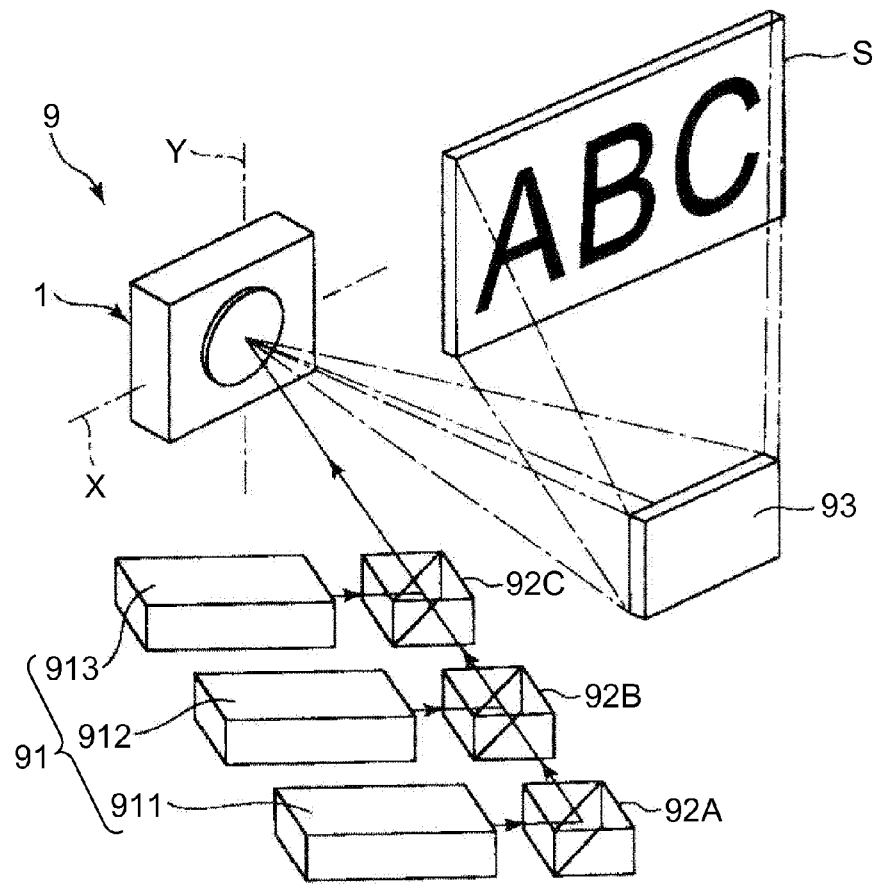
FIG. 13 is a diagram schematically illustrating an embodiment of an image display apparatus according to the invention.

FIG. 13 is a diagram schematically illustrating an embodiment of the image display apparatus according to the invention.

In this embodiment, an example of the image display apparatus in which the optical scanner 1 is used as an optical scanner of the display for imaging is described. In addition, a "longitudinal direction" of a screen S is referred to as a "traverse direction", and a direction perpendicular to a longitudinal direction is referred to as a "vertical direction". Further, the X axis is parallel to the traverse direction of the screen S, and the Y axis is parallel to the vertical direction of the screen S.

An image display apparatus (projector) 9 includes light source apparatuses (light sources) 91 that emit light such as laser, a plurality of dichroic mirrors 92A, 92B, and 92C, and the optical scanner 1.

The light source apparatuses 91 include a red light source apparatus 911 that emits red light, a blue light source apparatus 912 that emits blue light, and a green light source apparatus 913 that emits green light.

The respective dichroic mirrors 92A, 92B, and 92C are optical elements that synthesize light emitted from the red light source apparatus 911, the blue light source apparatus 912, and the green light source apparatus 913.

The image display apparatus 9 is configured to synthesize the light emitted from the light source apparatuses 91 (the red light source apparatus 911, the blue light source apparatus 912, the green light source apparatus 913) with the dichroic mirrors 92A, 92B, and 92C based on the image information from a host computer (not illustrated), to cause the optical scanner 1 to perform 2-dimensional scanning with the synthesized light, and to form a color image on the screen S.

When performing the 2-dimensional scanning, scanning (main scanning) in the traverse direction of the screen S is performed with light reflected from the light reflecting surface 114 by the rotation of the movable mirror portion 11 of the optical scanner 1 about the Y axis. Meanwhile, scanning (subscanning) in the vertical direction of the screen S is performed with light reflected from the light reflecting surface 114 by the rotation of the movable mirror portion 11 of the optical scanner 1 about the X axis.

Meanwhile, in FIG. 13, after the optical scanner 1 performs the 2-dimensional scanning with the light synthesized by the dichroic mirrors 92A, 92B, and 92C, the light is reflected from a fixed mirror 93, and an image is formed on the screen S. However, it is possible to omit the fixed mirror 93, and apply the light obtained by the optical scanner 1 performing the 2-dimensional scanning directly to the screen S.

Since the image display apparatus 9 described above includes the optical scanner 1, downsizing can be obtained, and start-up time can be shortened.

Hereinafter, the application example of the image display apparatus is described.

Application Example 1 of Image Display Apparatus

Figure 14:
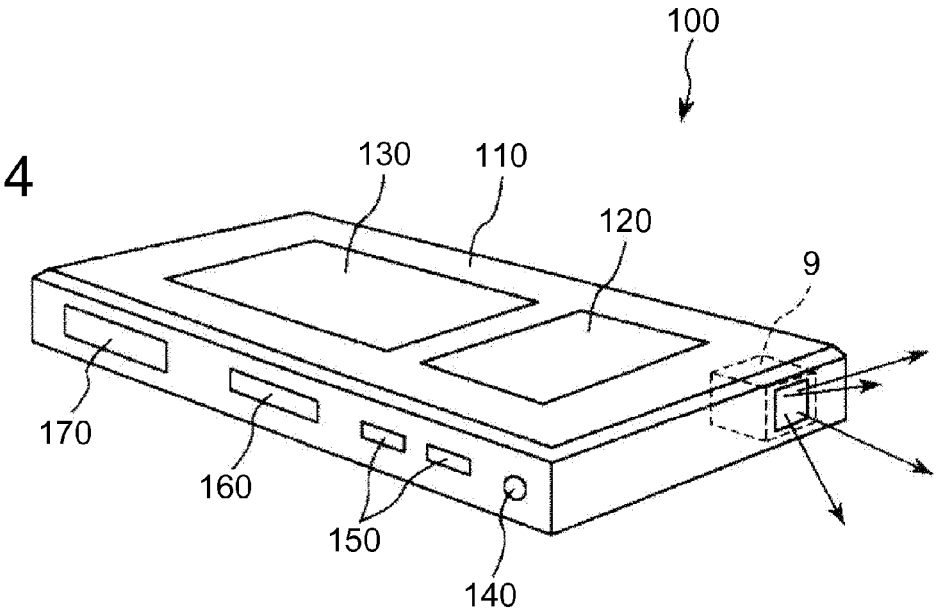
FIG. 14 is a perspective view illustrating an image display apparatus according to Application Example 1 of the invention.

FIG. 14 is a perspective view illustrating the image display apparatus according to Application Example 1 of the invention.

As illustrated in FIG. 14, the image display apparatus 9 is applied to a portable image display apparatus 100.

The portable image display apparatus 100 includes a housing 110 formed into a dimension that can be gripped by hand and the image display apparatus 9 embedded in the housing 110. For example, a predetermined image can be displayed on a predetermined surface such as a screen or a desktop by the portable image display apparatus 100.

Further, the portable image display apparatus 100 includes a display 120 that displays predetermined information, a keypad 130, an audio port 140, a control button 150, a card slot 160, and an AV port 170.

Further, the portable image display apparatus 100 may have other functions such as a telephone communication function, and a GPS reception function.

Application Example 2 of Image Display Apparatus

Figure 15:
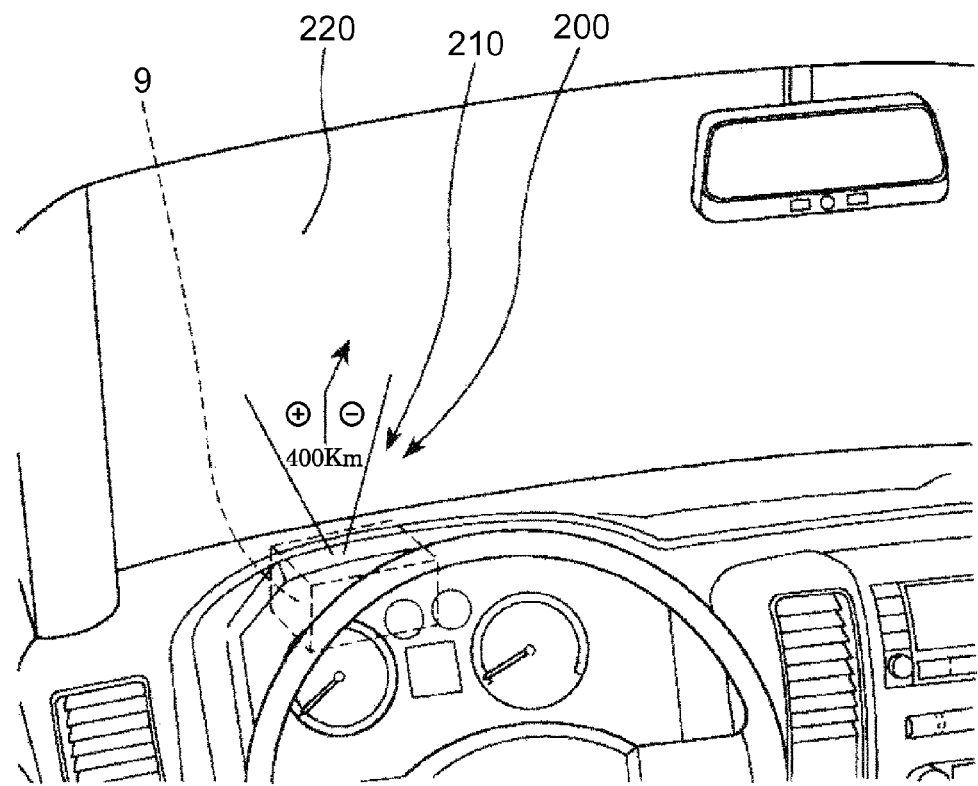
FIG. 15 is a perspective view illustrating an image display apparatus according to Application Example 2 of the invention.

FIG. 15 is a perspective view illustrating an image display apparatus according to Application Example 2 of the invention.

As illustrated in FIG. 15, the image display apparatus 9 can be applied to a head-up display system 200.

In the head-up display system 200, the image display apparatus 9 is mounted on a dashboard of a vehicle, to configure a head-up display 210. It is possible to display a predetermined image such as a guide display to a destination on a windshield 220, by the head-up display 210.

Also, the head-up display system 200 is not limited to a vehicle, and can be also applied to an airplane, a vessel, or the like.

Application Example 3 of Image Display Apparatus

Figure 16:
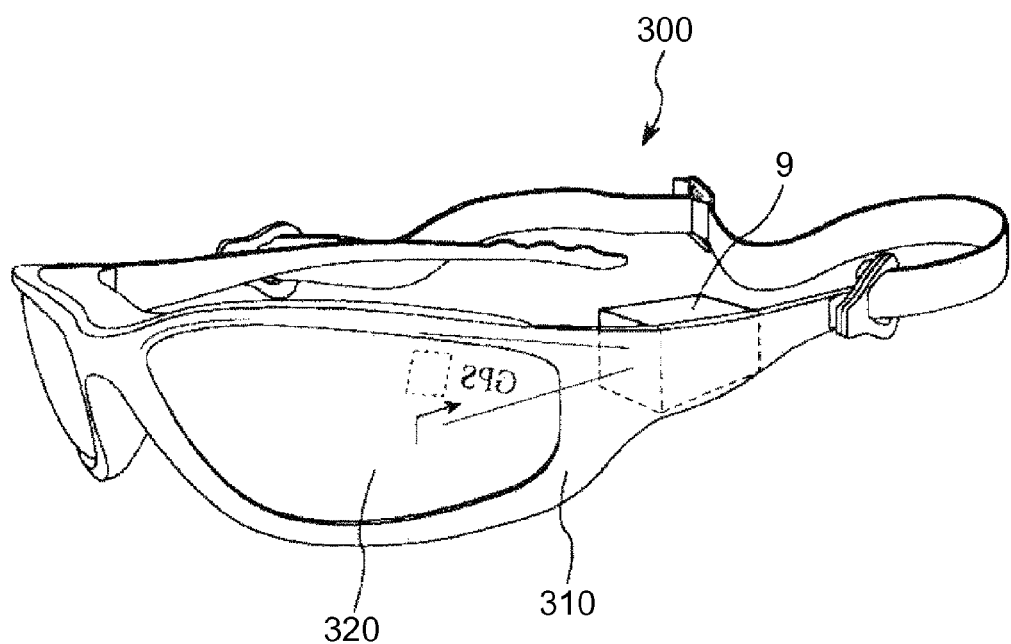
FIG. 16 is a perspective view illustrating an image display apparatus according to Application Example 3 of the invention.

FIG. 16 is a perspective view illustrating an image display apparatus according to Application Example 3 of the invention.

As illustrated in FIG. 16, the image display apparatus 9 is applied to a head-mount display 300.

That is, the head-mount display 300 includes glasses 310, and the image display apparatus 9 mounted on the glasses 310. Also, a predetermined image to be recognized by one eye is displayed on a display portion 320 disposed in a portion which is originally a lens of the glasses 310 by the image display apparatus 9.

The display portion 320 may be transparent, or may be opaque. If the display portion 320 is transparent, it is possible to add and use information from the image display apparatus 9 to information from an actual world.

In addition, it is possible to provide two image display apparatuses 9 with the head-mount display 300, and to display an image to be recognized by both eyes on two display portions.

In the above, the optical scanner, the image display apparatus, and the head-mount display according to the invention are described based on the embodiments as illustrated, but the invention is not limited thereto. For example, in the optical scanner, the image display apparatus, and the head-mount display according to the invention, configurations of the respective portions can be substituted to arbitrary configurations having the same function, or other configurations can be added.

The invention may be embodied by combining two arbitrary configurations (characteristics) among the respective embodiments described above.

In the embodiments described above, a case in which two (one pair) of first shaft portions are provided is described, but the invention is not limited thereto. For example, four (two pairs) of first shaft portions may be provided.

In the embodiments described above, a case in which four (two pairs) of second shaft portions are provided is described, but the invention is not limited to the aforementioned embodiments. For example, two (one pair) of second shaft portions or six (three pairs) or more of second shaft portions may be provided.

In the embodiments described above, an example in which the light reflecting plate covers a portion of the first shaft portion in the plan view is described, but the size of the light reflecting plate is not limited thereto. For example, the light reflecting plate may be formed to cover the frame body portion or the second shaft portion.

In the embodiments described above, an example in which the light reflecting plate and the spacer are formed by processing the SOI substrate is described, but the invention is not limited thereto. For example, the light reflecting plate and the spacer may be formed by other substrates, and the light reflecting plate and the spacer may be integrally formed by processing a substrate of a single material such as a silicon substrate, or a glass substrate.

The spacer between the light reflecting plate and the base portion may be a solder ball. In this case, for example, metal films are formed respectively on surfaces of the light reflecting plate and the base portion on the spacer side, and the metal films are joined with each other through the solder ball.

In the embodiments described above, an example in which a driving force is directly applied only to the frame body portion is described, but the driving force may be directly applied respectively to the frame body portion and the movable portion to swing the light reflecting plate about the first axis and the second axis. Even in this case, it is possible to obtain the effect of preventing or suppressing unnecessary vibrations of the light reflecting plate caused by unnecessary vibrations transmitted from the frame body portion to the movable portion through the first shaft portion.

In the embodiments described above, an example in which a moving magnet method is used as a method of driving the optical scanner is described, but the invention is not limited thereto. For example, a moving coil method, a piezoelectric drive method, an electrostatic drive method, or the like is used.

The entire disclosure of Japanese Patent Application No. 2013-268715, filed Dec. 26, 2013 is expressly incorporated by reference herein.

What is claimed is:

1. An optical scanner comprising:
   a base portion;
   a light reflecting portion that reflects light;
   a connection portion that connects the base portion and the light reflecting portion; and
   a shaft portion that supports the base portion in a swingable manner about a swing axis,
   wherein the light reflecting portion is disposed so that a geometrical center of the light reflecting portion is separated from the swing axis in a plan view seen in a direction in which the light reflecting portion and the base portion are lined up, and
   wherein a geometrical center of at least one of the base portion and the connection portion is positioned on an opposite side of the geometrical center of the light reflecting portion with respect to the swing axis in the plan view.

2. An optical scanner comprising:
   a base portion;
   a light reflecting portion that reflects light;
   a connection portion that connects the base portion and the light reflecting portion;
   a frame body portion that is disposed to surround the base portion;
   a first shaft portion that connects the base portion and the frame body portion, and supports the base portion in a swingable manner about a first axis; and
   a second shaft portion that supports the frame body portion in a swingable manner about a second axis intersecting the first axis,
   wherein the light reflecting portion is disposed so that a geometrical center of the light reflecting portion is positioned to be separated from the first axis or the second axis in a plan view seen in a direction in which the light reflecting portion and the base portion are lined up, and
   wherein a geometrical center of at least one of the base portion and the connection portion is positioned on the opposite side of the geometrical center of the light reflecting portion with respect to the first axis or the second axis in the plan view.

3. The optical scanner according to claim 2,
   wherein the geometrical center of the light reflecting portion is deviated from the first axis in the plan view.

4. The optical scanner according to claim 2,
   wherein the geometrical center of the light reflecting portion is deviated from the second axis in the plan view.

5. The optical scanner according to claim 2,
   wherein the geometrical center of the base portion is deviated from the first axis or the second axis in the plan view.

6. The optical scanner according to claim 2,
   wherein the geometrical center of the connection portion is deviated from the first axis or the second axis in the plan view.

7. The optical scanner according to claim 6,
   wherein side surfaces of the connection portion have tapers inclined to a direction in which the light reflecting portion and the base portion are lined up.

8. The optical scanner according to claim 7,
   wherein the tapers are disposed in a proximal portion and a distal portion with respect to the first axis or the second axis, and
   wherein the proximal portion and the distal portion have different inclination angular degrees with respect to the direction in which the light reflecting portion and the base portion are lined up.

9. The optical scanner according to claim 2,
   wherein both of the geometrical centers of the base portion and the connection portion are deviated from the first axis or the second axis in the plan view.

10. The optical scanner according to claim 9,
    wherein a shape of the base portion is identical to a shape of the connection portion in the plan view.

11. The optical scanner according to claim 1,
    wherein the light reflecting portion has an elliptical or oval shape along the first axis or the second axis in the plan view.

12. An image display apparatus comprising:
the optical scanner according to claim 1.
13. An image display apparatus comprising:
the optical scanner according to claim 2.
14. An image display apparatus comprising:
the optical scanner according to claim 3.
15. An image display apparatus comprising:
the optical scanner according to claim 4.
16. An image display apparatus comprising:
the optical scanner according to claim 5.
17. A head-mount display comprising:
the optical scanner according to claim 1.
18. A head-mount display comprising:
the optical scanner according to claim 2.
19. A head-mount display comprising:
the optical scanner according to claim 3.
20. A head-mount display comprising:
the optical scanner according to claim 4.

\* \* \* \* \*